(12) United States Patent
Kobayashi et al.

(10) Patent No.: US 8,030,828 B2
(45) Date of Patent: Oct. 4, 2011

(54) PIEZOELECTRIC DEVICE, PROCESS FOR PRODUCING THE PIEZOELECTRIC DEVICE, AND LIQUID DISCHARGE DEVICE

(75) Inventors: Hiroyuki Kobayashi, Kanagawa-ken (JP); Yukio Sakashita, Kanagawa-ken (JP)

(73) Assignee: FujiFilm Corporation, Tokyo (JP)

( * ) Notice: Subject to any disclaimer, the term of this patent is extended or adjusted under 35 U.S.C. 154(b) by 575 days.

(21) Appl. No.: 12/116,094

(22) Filed: May 6, 2008

(65) Prior Publication Data

US 2008/0278038 A1    Nov. 13, 2008

(30) Foreign Application Priority Data

May 7, 2007    (JP) ................... 2007-122099

(51) Int. Cl.
*H01L 41/08* (2006.01)
(52) U.S. Cl. ........................................ 310/358
(58) Field of Classification Search .................. 310/358, 310/365, 311, 364, 360; 252/62.9; 347/68, 347/70–71; *H01I 41/09, 41/08*
See application file for complete search history.

(56) References Cited

U.S. PATENT DOCUMENTS

| | | | | |
|---|---|---|---|---|
| 5,804,907 A | * | 9/1998 | Park et al. | 310/358 |
| 5,998,910 A | * | 12/1999 | Park et al. | 310/358 |
| 6,756,238 B2 | * | 6/2004 | Ogawa et al. | 438/3 |
| 7,015,628 B2 | * | 3/2006 | Matsushita et al. | 310/358 |
| 2006/0279178 A1 | | 12/2006 | Ren | |

FOREIGN PATENT DOCUMENTS

JP    2004-363557 A    12/2004
WO    WO-2007/034903 A1    3/2007

OTHER PUBLICATIONS

Xiaobing Ren, Nature Materials, vol. 3, pp. 91-94, 2004.
R. Chu., Applied Physics Letters, vol. 86, pp. 012905-1-012905-2, 2005.
J.J. Liu et al., Applied Physics Letters, vol. 88, pp. 032904-1-032904-3, 2006.

* cited by examiner

*Primary Examiner* — Walter Benson
*Assistant Examiner* — Karen B Addison
(74) *Attorney, Agent, or Firm* — Birch, Stewart, Kolasch & Birch, LLP

(57) ABSTRACT

A piezoelectric device includes a piezoelectric film, and electrodes through which an electric field can be applied to the piezoelectric film along the thickness direction of the piezoelectric film. The piezoelectric film contains a ferroelectric phase in which the thickness direction and a normal of a plane determined by the spontaneous-polarization axis and the axis makes an angle θm satisfying the condition that −45 degrees<θm<+45 degrees and θm≠0 degrees. Further, the spontaneous-polarization axis or the axis may be perpendicular to the thickness direction of the piezoelectric film.

36 Claims, 9 Drawing Sheets

TETRAGONAL CRYSTAL

ORTHORHOMBIC CRYSTAL

RHOMBOHEDRAL CRYSTAL

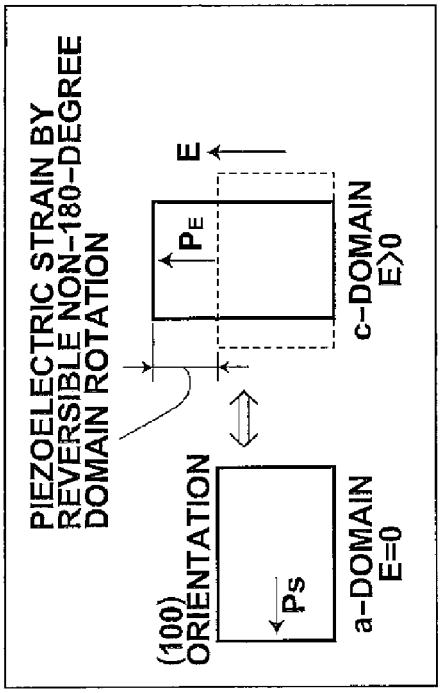
FIG.4A CONVENTIONAL SYSTEM
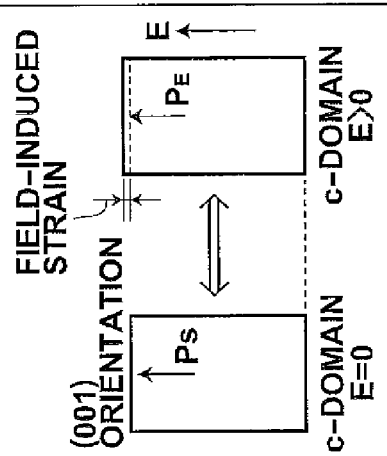
FIG.4B SYSTEM OF JP2004-363557 or NONPATENT REFERENCE 1
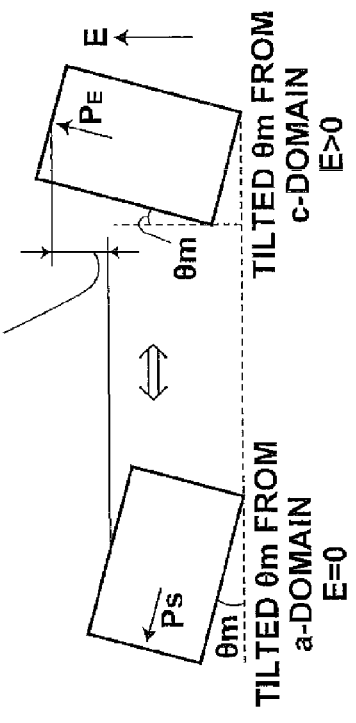
FIG.4C SYSTEM ACCORDING TO PRESENT INVENTION

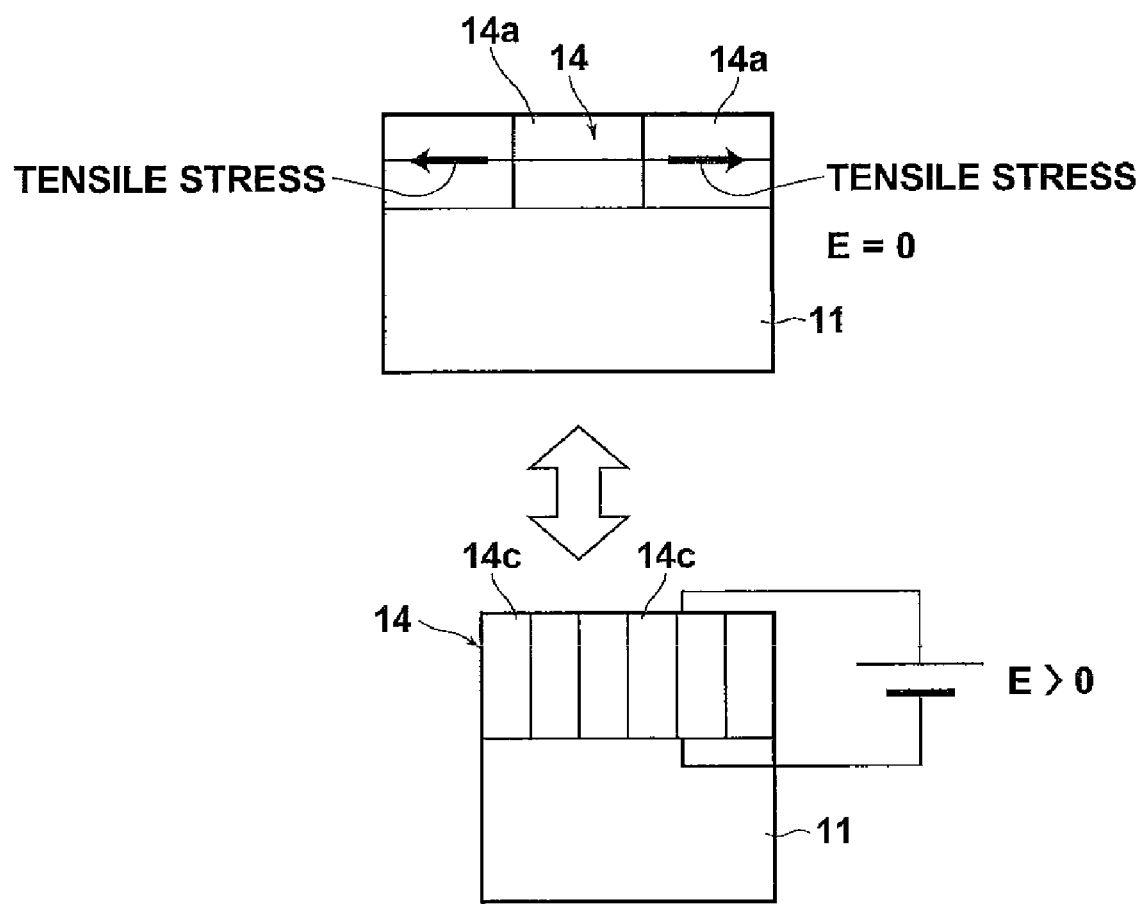

(200) POLE FIGURE OF PIEZOELECTRIC FILM OF Nb-DOPED PZT
(WITH MPB COMPOSITION) IN CONCRETE EXAMPLE

φ SCAN PROFILE OF (200) POLE FIGURE OF PIEZOELECTRIC FILM OF
Nb-DOPED PZT (WITH MPB COMPOSITION) IN CONCRETE EXAMPLE

(111) POLE FIGURE OF Pt LOWER ELECTRODE IN CONCRETE EXAMPLE

φ SCAN PROFILE OF (111) POLE FIGURE OF Pt LOWER ELECTRODE IN CONCRETE EXAMPLE

(200) POLE FIGURE OF PIEZOELECTRIC FILM OF Nb-DOPED PZT (TETRAGONAL) IN COMPARISON EXAMPLE

φ SCAN PROFILE OF (200) POLE FIGURE OF PIEZOELECTRIC FILM OF Nb-DOPED PZT (TETRAGONAL) IN COMPARISON EXAMPLE

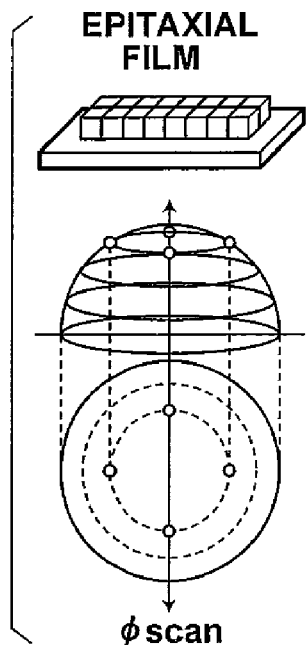
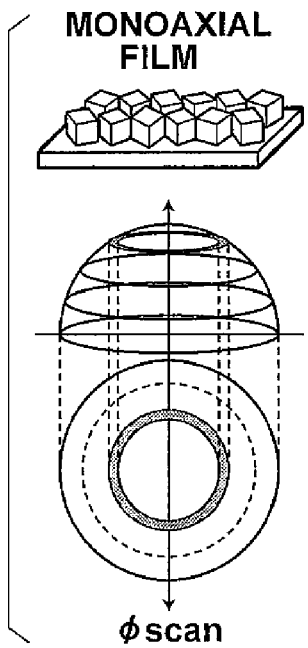
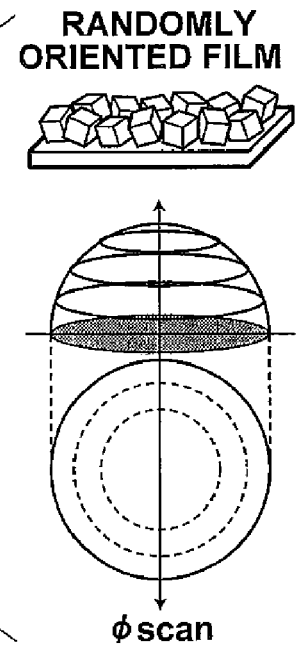
FIG. 11A  FIG. 11B  FIG. 11C
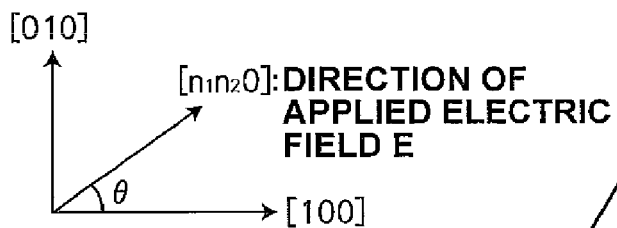
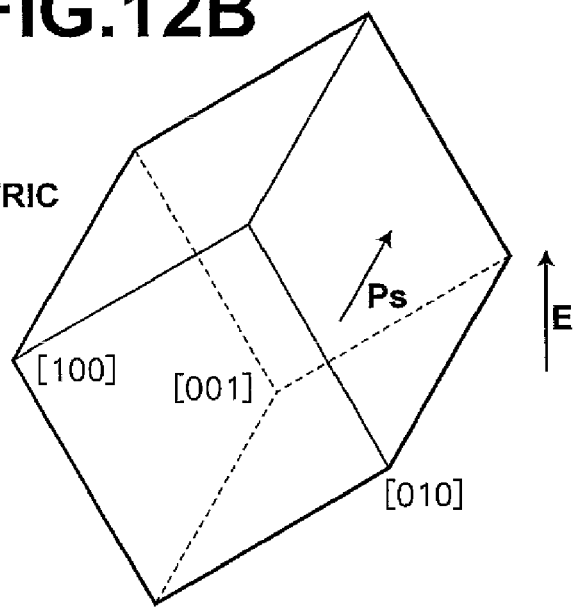
FIG. 12A  FIG. 12B

PIEZOELECTRIC DEVICE, PROCESS FOR PRODUCING THE PIEZOELECTRIC DEVICE, AND LIQUID DISCHARGE DEVICE

BACKGROUND OF THE INVENTION

1. Field of the Invention

The present invention relates to a piezoelectric device which takes advantage of reversible non-180-degree domain rotation. The present invention also relates to a process for producing the above piezoelectric device, and a liquid discharge device using the above piezoelectric device.

2. Description of the Related Art

Currently, the piezoelectric devices constituted by a piezoelectric body and electrodes are used as, for example, piezoelectric actuators installed in inkjet recording heads. In such piezoelectric devices, the piezoelectric body expands and contracts in response to increase and decrease in the strength of an electric field applied from the electrodes to the piezoelectric body. For example, perovskite oxides such as PZT (lead titanate zirconate) are known as materials suitable for the piezoelectric body. The piezoelectric materials are ferroelectric materials, which exhibit spontaneous polarization even when no electric field is applied.

In the conventional piezoelectric devices, the field-induced strain (i.e., the piezoelectric stain along the spontaneous-polarization axis of the ferroelectric body) is commonly utilized by applying an electric field along the direction of the spontaneous-polarization axis, i.e., the direction of the applied electric field is commonly identical to the direction of the spontaneous-polarization axis. However, since the magnitude of displacement is limited in the case where only the field-induced strain of the ferroelectric body is utilized, demands for greater displacement is increasing.

In the above circumstances, piezoelectric devices taking advantage of the non-180-degree domain rotation (such as the 90-degree domain rotation) have been proposed. In the case where the 180-degree domain rotation is utilized, the orientation of the spontaneous-polarization axis merely turns upside down. Therefore, the 180-degree domain rotation does not contribute to increase in the piezoelectric strain beyond the field-induced strain. On the other hand, the non-180-degree domain rotation such as the 90-degree domain rotation increases the piezoelectric strain beyond the field-induced strain.

Although the non-180-degree domain rotation per se is conventionally known, the non-180-degree domain rotation is conventionally considered to have poor usability since the non-180-degree domain rotation is normally irreversible. However, Japanese Unexamined Patent Publication No. 2004-363557 (hereinafter referred to as JP2004-363557) and X. Ren, "Large Electric-field-induced Strain in Ferroelectric Crystals by Point-defect-mediated Reversible Domain Switching", Nature Materials, Vol. 3, pp. 91-94, 2004 (hereinafter referred to as the nonpatent reference 1) disclose piezoelectric materials in which movable point defects are located so that the symmetry in the short-range order of the movable point defects coincides with the crystal symmetry in ferroelectric phases.

JP2004-363557 and the nonpatent reference 1 disclose preparation of:

(1) A sample of a monocrystal of $BaTiO_3$ which is produced by the flux technique, cooled, and aged at a temperature not higher than the Curie temperature (as disclosed as "EXAMPLE 1" in JP2004-363557);

(2) A sample of a monocrystal of $BaTiO_3$ doped with a small amount of potassium (i.e., $(BaK)TiO_3$), which is produced by the flux technique, cooled, and aged at a temperature not higher than the Curie temperature (as disclosed as "EXAMPLE 2" in JP2004-363557);

(3) A ceramic sample of $(Pb, La)(Zr, Ti)O_3$ (PLZT) aged for 30 days at room temperature (as disclosed as "EXAMPLE 3" in JP2004-363557); and (4) A ceramic sample of $BaTiO_3$ doped with a small amount of iron (i.e., Fe—BT), which is aged for 5 days at 80° C. (as disclosed as "EXAMPLE 5" in JP2004-363557).

It is reported that tetragonal phases forming a-domains (in each of which the spontaneous-polarization axis is perpendicular to the direction of an applied electric field) are formed in the above samples, and reversible 90-degree rotation of the a-domains occurs. In addition, "FIG. 7" in JP2004-363557 shows that the magnitude of the piezoelectric strain which can be achieved by use of the reversible 90-degree domain rotation in a ferroelectric substance is far greater than the magnitude of the piezoelectric strain which can be achieved by use of only the normal piezoelectric strain along the polarization axis (produced by the application of an electric field along the polarization axis of the ferroelectric substance).

In addition, R. Chu et al., "Ultrahigh Piezoelectric Response Perpendicular to Special Cleavage Plane in $BaTiO_3$ Single Crystals", Applied Physics Letters, Vol. 86, pp. 012905-1-012905-2, 2005 (hereinafter referred to as the nonpatent reference 2) and J. J. Liu et al., "Engineering Domain Configurations for Enhanced Piezoelectricity in Barium Titanate Single Crystals," Applied Physics Letters, Vol. 88, pp. 032904-1-032904-3, 2006 (hereinafter referred to as the nonpatent reference 3) disclose structures which are slightly tilted from the attitudes of a-domains, and in which reversible 90-degree domain rotation can occur.

Specifically, the abstract and some other portions of the nonpatent reference 2 indicate that while the piezoelectric constant $d_{33(001)}$ of a $BaTiO_3$ monocrystal (having a c-domain) is measured to be 87 pC/N by applying an electric field to the crystal along the [001] direction (perpendicular to the (001) face of the crystal), the piezoelectric constant $d_{33(270)}$ of the same $BaTiO_3$ monocrystal is measured to be 2000 pC/N (i.e., more than twenty times greater than the above piezoelectric constant $d_{33(001)}$) by cleaving the monocrystal along the (270) plane and applying an electric field to the cleaved monocrystal along the [720] direction (perpendicular to the (270) face of the crystal). The (270) face is tilted from the (100) face by 16 degrees.

Further, the nonpatent reference 3 indicates values of the piezoelectric constants calculated in consideration of both of the field-induced strain and the reversible 90-degree domain rotation which are caused by application of an electric field to a $BaTiO_3$ monocrystal along the $[n_1\ n_2\ 0]$ direction, and the piezoelectric constant $d_{33}$ has been shown to reach the maximum value of 1300 pC/N when the electric field is applied to the crystal along a direction which is tilted from the [100] axis (i.e., the a-axis) by 5 or 85 degrees. (See page 032904-3, left column, line 7 and FIG. 4 in the nonpatent reference 3.) FIG. 12A shows the a-axis, the b-axis (i.e., the [010] axis), the $[n_1\ n_2\ 0]$ direction (along which the electric field is applied), and the angle q between the a-axis and the $[n_1\ n_2\ 0]$ direction.

FIG. 12B schematically indicates a unit cell in a tetragonal crystal having a tilted domain as indicated in the nonpatent references 2 and 3. The unit cell indicated in FIG. 12B has the shape of a rectangular parallelepiped which is elongated in the depth direction in the illustration. In the tilted domain structure indicated in each of the nonpatent references 2 and 3, the c-axis (as the spontaneous-polarization axis) is perpendicular to the direction along which the electric field is applied to the tetragonal crystal, and is not tilted from the c-axis of the normal a-domain, and the a-axis and the b-axis are tilted from the a-axis and the b-axis of the normal a-domain. In other words, the (110) face in each of the nonpatent references 2 and 3, which is determined by the a-axis and the b-axis, is tilted from the (110) face of the normal a-domain. (The (110) face of the normal a-domain is illustrated in the upper part of FIG. 3.) In FIGS. 12B and 3, $P_S$ indicates the direction of the spontaneous-polarization axis.

However, the techniques disclosed in JP2004-363557 and the nonpatent references 1 to 3 have the following problems (1) to (4).

(1) Since the size and weight of the electronic devices are decreasing and the functions of the electronic devices are being sophisticated, development of the piezoelectric devices for reducing the size and weight of the piezoelectric devices and improving the functions of the piezoelectric devices are proceeding. For example, in the field of the inkjet recording heads, techniques for increasing the density of arrangement of piezoelectric devices are currently being studied in order to improve image quality. For this purpose, techniques for producing piezoelectric devices having a thin piezoelectric film, instead of the bulk piezoelectric body, are also being studied.

However, JP2004-363557A and the nonpatent references 1 and 2 disclose only the results of studies on bulk monocrystals and bulk ceramics, and do not refer to films and application of the reversible non-180-degree domain rotation to piezoelectric films.

(2) The nonpatent references 2 and 3 do not disclose a method for forming a piezoelectric film having a tilted domain structure as mentioned before (in which the c-axis as the spontaneous-polarization axis is perpendicular to the direction along which the electric field is applied, and is not tilted from the c-axis of the normal a-domain, and the a-axis and the b-axis are tilted from the a-axis and the h-axis of the normal a-domain).

(3) The technique disclosed in the nonpatent reference 2 (in which a monocrystal is cleaved along a high-index face (i.e., the (270) face)) requires laborious and expensive processes, and has difficulty in fine processing on the order of micrometers and integration on a substrate.

(4) The nonpatent reference 3 indicates only the results of theoretical calculation, discloses no concrete process for producing even a bulk crystal, and does not indicate whether or not the results of theoretical calculation match with the actual piezoelectric characteristics. When a piezoelectric film is formed on a substrate, it is necessary to consider the stress and the like which the substrate imposes on the piezoelectric film. However, since the piezoelectric film is not considered in the nonpatent reference 3, the substrate is not considered in theoretical calculation. Therefore, even when the results of theoretical calculation are assumed to match with the actual piezoelectric characteristics, it is unknown whether or not the piezoelectric films have theoretically calculated characteristics.

SUMMARY OF THE INVENTION

The present invention has been made in view of such circumstances.

The first object of the present invention is to provide a piezoelectric device having a piezoelectric film in which reversible non-180-degree domain rotation contributes to production of piezoelectric strain and which exhibits high piezoelectric performance.

The second object of the present invention is to provide a process for producing the piezoelectric device achieving the first object.

The third object of the present invention is to provide a liquid discharge device using the piezoelectric device achieving the first object.

The present inventors have found that reversible non-180-degree domain rotation effectively occurs in novel tilted domain structures other than the tilted domain structures disclosed in the nonpatent references 2 and 3. The piezoelectric device according to the present invention includes a piezoelectric device having a piezoelectric film which has such a tilted domain structure, and the process according to the present invention produces such a piezoelectric device.

(I) In order to accomplish the first object, the piezoelectric devices according to the first, second, and third aspects of the present invention are provided. The piezoelectric devices according to each of the first, second, and third aspects of the present invention is constituted by a piezoelectric film, and electrodes through which an electric field can be applied to the piezoelectric film along the thickness direction of the piezoelectric film.

The piezoelectric device according to the first aspect of the present invention is characterized in that the piezoelectric film contains a ferroelectric phase in which the thickness direction (i.e., the direction of the applied electric field) and a normal of a plane determined by the spontaneous-polarization axis and the [010] axis makes an angle θm satisfying the condition that −45 degrees<θm<+45 degrees and θm≠0 degrees.

The piezoelectric device according to the second aspect of the present invention is characterized in that the spontaneous-polarization axis is perpendicular to the thickness direction (i.e., the direction of the applied electric field), and the thickness direction and a normal of a plane determined by the spontaneous-polarization axis and the [010] axis makes an angle θm satisfying the condition that −45 degrees<θm<+45 degrees and θm≠0 degrees.

The piezoelectric device according to the third aspect of the present invention is characterized in that the [010] axis is perpendicular to the thickness direction (i.e., the direction of the applied electric field), and the thickness direction and a normal of a plane determined by the spontaneous-polarization axis and the [010] axis makes an angle θm satisfying the condition that −45 degrees<θm<+45 degrees and θm≠0 degrees.

According to the present invention, the normal of the plane determined by the spontaneous-polarization axis and the [010] axis is tilted by the angle θm from the direction along which the electric field is applied to the piezoelectric film, so that reversible non-180-degree domain rotation can more effectively occur in the piezoelectric devices according to the first, second, and third aspects of the present invention than in the conventional piezoelectric devices in which the normal of the plane determined by the spontaneous-polarization axis and the [010] axis is perpendicular to the direction along which the electric field is applied. Therefore, the piezoelectric films in the piezoelectric devices according to the first, second, and third aspects of the present invention can exhibit high piezoelectric performance.

Although the aforementioned nonpatent references 2 and 3 disclose the tilted domain structure in which the spontaneous-polarization axis is perpendicular to the direction along which the electric field is applied, the present invention uses other types of novel tilted domain structures.

In each ferroelectric phase, the spontaneous-polarization axis is determined according to the crystal system. In this specification, the [010] axis is defined on the basis of the spontaneous-polarization axis. For example, the [010] axis in the case where the ferroelectric phase is the tetragonal phase is the [010] axis which is determined when the spontaneous-polarization axis is defined as the [001] axis, the [010] axis in the case where the ferroelectric phase is the orthorhombic phase is the [010] axis which is determined when the spontaneous-polarization axis is defined as the [110] axis, and the [010] axis in the case where the ferroelectric phase is the rhombohedral phase is the [010] axis which is determined when the spontaneous-polarization axis is defined as the [111] axis.

In each of the piezoelectric devices according to the first, second, and third aspects of the present invention, the orientations, with respect to the direction of the applied electric field, of the normals of the planes determined by the spontaneous-polarization axes and the [010] axes, and/or the tilt angles θm of the normals from the direction of the applied electric field may vary and have a distribution. The oriented crystalline films are examples of piezoelectric films having such a distribution. Mostly, the oriented crystalline films are monoaxially-oriented films, and it is possible to realize oriented crystalline films in which the orientations, with respect to the direction of the applied electric field, of the normals of the planes determined by the spontaneous-polarization axes and the [010] axes have a distribution although the tilt angles θm of the normals from the direction of the applied electric field are approximately identical.

However, in the piezoelectric film in each of the piezoelectric devices according to the first, second, and third aspects of the present invention, the orientations, with respect to the direction of the applied electric field, of the normals of the planes determined by the spontaneous-polarization axes and the [010] axes, as well as the tilt angles θm of the normals from the direction of the applied electric field, may also be approximately identical. The films in which the orientations, with respect to the direction of the applied electric field, of the normals of the planes determined by the spontaneous-polarization axes and the [010] axes, as well as the tilt angles θm of the normals from the direction of the applied electric field, are also approximately identical are triaxially-oriented films such as epitaxial films.

In this specification, the crystalline substance is determined to be "oriented" when the degree F. of orientation measured by the Lotgering technique is 80% or higher. The degree F. of orientation is defined as $F(\%) = (P-P0)/(1-P0) \times 100$, where P is the ratio of the total XRD (X-ray diffraction) intensity from an orientation plane to the total XRD intensity from all the crystal planes, and P0 is the value of P in the case where the sample is completely randomly oriented. In the case of the (001) orientation, $P=\Sigma I(001)/\Sigma I(hkl)$, where I(hkl) is the XRD intensity from the crystal plane (hkl), $\Sigma I(001)$ is the total XRD intensity from the crystal plane (001), and $\Sigma I(hkl)$ is the total XRD intensity from all the crystal planes (hkl). For example, in the case of the (001) orientation in a perovskite crystal, $P=I(001)/\{I(001)+I(100)+I(101)+I(110)+I(111)\}$. When the sample is completely randomly oriented (i.e., when P=P0), F=0%. When the sample is completely oriented (i.e., when P=1), F=100%.

The normal of a plane determined by the spontaneous-polarization axis and the [010] axis and the tilt angle θm of the normal from the direction of the applied electric field can be obtained from the XRD pole figure (polar projection) measurement. In the polar projection measurement, a distribution of the normals of crystal faces having a specific Miller index (hkl) and being contained in a specimen is obtained on the basis of the intensity distribution of X-ray diffraction of the specimen. The intensity distribution of X-ray diffraction is obtained while rotating the specimen in a plane containing the specimen surface and changing the inclination angle of the specimen surface with respect to the plane containing the incident X rays and Bragg-reflected X rays. The intensity of the X-ray diffraction at each in-plane rotation angle and each inclination angle (i.e., at each of the orientations of the normals) is (polar) projected onto a hemisphere surrounding the specimen, and is further projected from the hemisphere onto a plane so that the distribution of the normals is indicated by a contour map on the plane.

FIGS. 11A, 11B, and 11C schematically indicate XRD pole figures of an epitaxial (triaxially-oriented) film, a monoaxially-oriented film, and a randomly-oriented film.

As indicated in FIGS. 11A, 11B, and 11C, the orientations corresponding to high XRD intensities are observed as spots in the XRD pole figure of the epitaxial film, and as a ring in the XRD pole figure of the monoaxially-oriented film. On the other hand, the distribution observed in the XRD pole figure of the randomly-oriented film is uniform.

In the XRD pole figures of films in a state intermediate between the epitaxial film and the monoaxially-oriented film, the orientations corresponding to relatively high XRD intensities are observed as a ring, and the intensities at the various positions in the ring vary. The tilt angle θm of the normal (of a plane determined by the spontaneous-polarization axis and the [010] axis) from the direction of the applied electric field can be evaluated as the value of the angle Φ of the top of the peak in a Φ scan profile (which corresponds to a cross section of the XRD pole figure), where the angle Φ is the inclination angle of the specimen surface with respect to the plane containing the incident X rays and Bragg-reflected X rays. The distribution of the tilt angle θm of the normal from the direction of the applied electric field can be evaluated as the half width of the peak in the Φ scan profile.

In this specification, the expression "the tilt angles θm of the normals from the direction of the applied electric field are approximately identical" means that the half width of the peak in the Φ scan profile does not exceed 20 degrees. For example, the half widths of the peaks in the Φ scan profiles of the epitaxial films do not exceed 2 degrees.

The piezoelectric film in which the orientations, with respect to the direction of the applied electric field, of the normals of the planes determined by the spontaneous-polarization axes and the [010] axes, as well as the tilt angles θm of the normals from the direction of the applied electric field, are also approximately identical is preferably an epitaxial film which is formed over a surface of a monocrystalline substrate. In this case, it is further preferable that the surface of the monocrystalline substrate be tilted by the angle θs from a low-index face of the monocrystalline substrate, and the angle θs satisfies the condition that −45 degrees<θs<+45 degrees and θs≠0 degrees. In this case, it is possible to produce a piezoelectric film having a structure in which the tilt angle θs from the low-index face is identical to the angle θm between the thickness direction and the normal of the plane determined by the spontaneous-polarization axis and the [010] axis.

Furthermore, in each of the piezoelectric devices according to the first, second, and third aspects of the present invention, the electrodes are a lower electrode and an upper electrode, the lower electrode is formed between the surface of the monocrystalline substrate and the piezoelectric film, and the upper electrode is formed on the piezoelectric film. It is preferable that only the lower electrode or each of the lower electrode and the upper electrode be an epitaxial film. It is also preferable that the monocrystalline substrate be made of silicon or oxide.

In this specification, the low-index face is defined as a face being indicated by the Miller index (abc) and satisfying the condition that each of a, b, and c equals 0 or 1, and $a+b+c \geq 1$.

The piezoelectric film in each of the piezoelectric devices according to the first, second, and third aspects of the present invention contains a ferroelectric phase forming a domain in which reversible non-180-degree domain rotation can occur in response to increase or decrease in the strength of the electric field applied to the piezoelectric film. In the reversible non-180-degree domain rotation, the polarization axis of the domain can reversibly rotate by an angle different from 180 degrees in response to increase or decrease in the strength of the electric field.

The ferroelectric phase may have a structure corresponding to one of the tetragonal, orthorhombic, and rhombohedral crystal systems, or a mixture of structures corresponding to two or all of the tetragonal, orthorhombic, and rhombohedral crystal systems. In the case where the crystal system of the ferroelectric phase is the tetragonal system, the ferroelectric phase forms a domain in which reversible 90-degree domain rotation can occur in response to increase or decrease in the strength of the electric field applied to the piezoelectric film. In the reversible 90-degree domain rotation, the polarization axis of the domain can reversibly rotate 90 degrees in response to increase or decrease in the strength of the electric field.

It is preferable that the ferroelectric phase in the piezoelectric film have a perovskite structure. In this case, it is further preferable that the main component of the piezoelectric film be a perovskite oxide which is expressed by a compositional formula $ABO_3$, or a mixture of perovskite oxides each of which is expressed by a compositional formula $ABO_3$, where A represents one or more A-site elements which are one or more of Pb, Ba, La, Sr, Bi, Li, Na, Ca, Cd, Mg, and K, B represents one or more B-site elements which are one or more of Ti, Zr, V, Nb, Ta, Cr, Mo, W, Mn, Sc, Co, Cu, In, Sn, Ga, Zn, Cd, Fe, Ni, and the lanthanide elements, and O represents the oxygen element. Although the ratio of the total molar amount of atoms of the one or more A-site elements to the molar amount of the oxygen atoms and the ratio of the total molar amount of atoms of the one or more B-site elements to the molar amount of the oxygen atoms are each normally equal to 1:3 in each perovskite oxide, each ratio may deviate from 1:3 within a range in which a perovskite structure can be formed. In this specification, the term "main component" means a component the content of which is 80 weight percent or higher.

(II) In order to accomplish the second object, according to the fourth aspect of the present invention, a process for producing a piezoelectric device is provided, where the piezoelectric device is constituted by a piezoelectric film and electrodes through which an electric field can be applied to the piezoelectric film along the thickness direction of the piezoelectric film. The process according to the fourth aspect of the present invention is characterized in comprising the steps of: (a) preparing a monocrystalline substrate having a surface which is tilted by an angle $\theta s$ from a low-index face of the monocrystalline substrate, where the angle $\theta s$ satisfies the condition that $-45$ degrees $< \theta s <+45$ degrees and $\theta s \neq 0$ degrees; and (b) forming a piezoelectric film over the surface of the monocrystalline substrate by epitaxial growth.

(III) In order to accomplish the third object, according to the fifth aspect of the present invention, a liquid discharge device is provided. The liquid discharge device according to the fifth aspect of the present invention is characterized in comprising: the piezoelectric device according to either of the first, second, and third aspects of the present invention and a discharge member, where the discharge member includes a liquid-reserve chamber which reserves liquid, and a liquid-discharge outlet through which the liquid is discharged from the liquid-reserve chamber.

DESCRIPTION OF THE DRAWINGS

FIG. 4A is a diagram schematically illustrating the conventional field-induced strain in a system in which the reversible non-180-degree domain rotation does not occur.

FIG. 4B is a diagram schematically illustrating an example of piezoelectric strain produced in a system in which the reversible non-180-degree domain rotation occurs as disclosed in JP2004-363557A and the nonpatent references 1.

FIG. 4C is a diagram schematically illustrating an example of piezoelectric strain produced in a system according to the present invention in which the a-axis and the c-axis (as the spontaneous-polarization axis) are tilted by the angle $\theta m$ from the a-axis and the c-axis of the normal a-domain.

FIG. 5 is a diagram provided for explaining that the reversible non-180-degree domain rotation can stably occur when thermal expansion coefficients of a substrate and a piezoelectric film are in an appropriate relationship.

FIGS. 11A, 11B, and 11C schematically indicate XRD pole figures of an epitaxial film, a monoaxially-oriented film, and a randomly-oriented film.

FIG. 12A is a diagram schematically illustrating the a-axis, the b-axis (i.e., the [010] axis), the $[n_1\ n_2\ 0]$ direction (along which the electric field is applied), and the angle q between the a-axis and the $[n_1\ n_2\ 0]$ direction.

FIG. 12B is a diagram schematically illustrating a unit cell in a tetragonal crystal having the tilted domain structure as disclosed in the nonpatent references 2 and 3.

DESCRIPTION OF PREFERRED EMBODIMENTS

A preferred embodiment of the present invention is explained in detail below with reference to drawings.

1. Piezoelectric Device and Inkjet Recording Head

Figure 1:
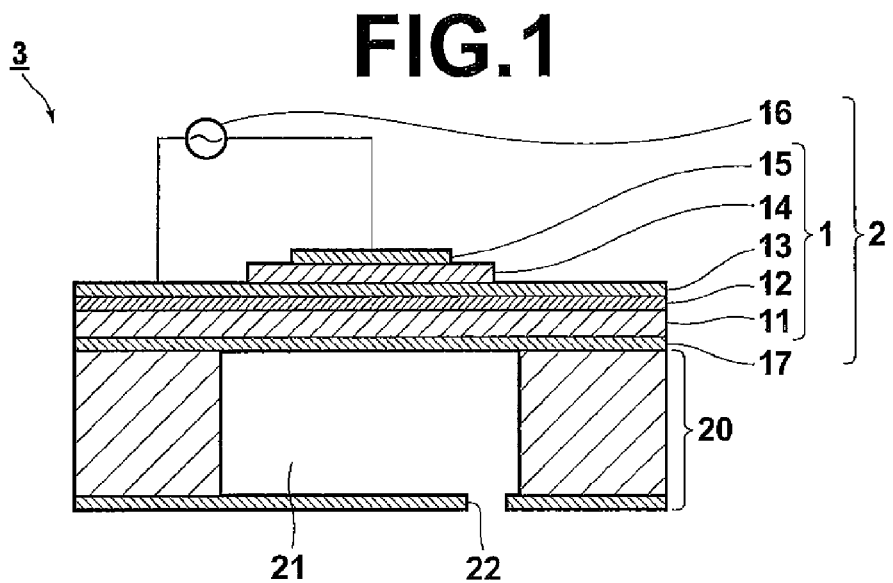
FIG. 1 is a cross-sectional view schematically illustrating a cross section of an essential portion of an inkjet recording head (as a liquid discharge device) having a piezoelectric device according to an embodiment of the present invention.

Hereinbelow, the structures of a piezoelectric device as an embodiment of the present invention and an inkjet recording head (as a liquid discharge device) using the piezoelectric device are explained with reference to FIG. 1, which schematically shows a cross section of an essential portion of the inkjet recording head containing the piezoelectric device. In FIG. 1, the respective elements are illustrated schematically, and the dimensions of the illustrated elements are different from the dimensions of the elements of the actual system.

As illustrated in FIG. 1, the inkjet recording head 3 contains a piezoelectric actuator 2 and an ink nozzle 20, and the piezoelectric actuator 2 includes a piezoelectric device 1.

The piezoelectric device 1 is a device produced by forming on a surface of a substrate 11 a buffer layer 12, a lower electrode 13, a piezoelectric film 14, and an upper electrode 15 in this order in such a manner that an electric field can be applied to the piezoelectric film 14 through the lower electrode 13 and the upper electrode 15.

The piezoelectric actuator 2 further includes a diaphragm 17 and a controller 16 as well as the piezoelectric device 1. The diaphragm 17 is attached to the back surface of the substrate 11 so that the diaphragm 17 can vibrate in response to expansion and contraction of the piezoelectric film 14. The controller 16 includes a driver circuit and the like for driving the piezoelectric device 1.

The inkjet recording head 3 is produced by attaching the ink nozzle 20 to the back surface of the piezoelectric actuator 2. The ink nozzle 20 is a member for reserving and discharging ink, and comprises an ink chamber 21 (as a liquid-reserve chamber) and an ink outlet 22 (as a liquid-discharge outlet) connected to the ink chamber 21. The ink chamber 21 reserves ink, and the ink held in the ink chamber 21 is discharged out of the ink chamber 21 through the ink outlet 22.

In the inkjet recording head 3, the strength of the electric field applied to the piezoelectric device 1 is increased or decreased so as to expand or contract the piezoelectric device 1 and control the discharge and the discharge amount of the ink.

Alternatively, it is possible to process predetermined portions of the substrate 11 into the diaphragm 17 and the ink nozzle 20, instead of attaching the diaphragm 17 and the ink nozzle 20 to the piezoelectric device 1. For example, the ink chambers 21 can be formed by etching the predetermined portions of the substrate 11 from the bottom, and the diaphragm 17 and the other structures of the ink nozzle 20 can also be formed by processing the substrate 11 per se.

It is preferable that the piezoelectric film 14 have a perovskite structure. The perovskite structure may be a simple perovskite structure, a complex perovskite structure, or a laminate perovskite structure. It is particularly preferable that the piezoelectric film 14 have a simple perovskite structure or a complex perovskite structure.

It is also preferable that the main component of the piezoelectric film be a perovskite oxide which is expressed by a compositional formula $ABO_3$, or a mixture of perovskite oxides each of which is expressed by a compositional formula $ABO_3$, where A represents one or more A-site elements which are one or more of Pb, Ba, La, Sr, Bi, Li, Na, Ca, Cd, Mg, and K, B represents one or more B-site elements which are one or more of Ti, Zr, V, Nb, Ta, Cr, Mo, W, Mn, Sc, Co, Cu, In, Sn, Ga, Zn, Cd, Fe, Ni, and the lanthanide elements, and O represents the oxygen element. Although the ratio of the total molar amount of atoms of the one or more A-site elements to the molar amount of the oxygen atoms and the ratio of the total molar amount of atoms of the one or more B-site elements to the molar amount of the oxygen atoms are each normally equal to 1:3 in each perovskite oxide, each ratio may deviate from 1:3 within a range in which a perovskite structure can be formed.

Specifically, the piezoelectric film 14 may be constituted by one of the lead-containing compounds (1) and the nonlead compounds (2) indicated below, or a mixed crystal of two or more of the lead-containing compounds (1) and the nonlead compounds (2).

(1) Lead-containing compounds such as lead titanate, lead titanate zirconate (PZT), lead zirconate, lead lanthanum titanate, lead lanthanum titanate zirconate, lead magnesium niobate-lead zirconium titanate, lead nickel niobate-lead zirconium titanate, lead zinc niobate-lead zirconium titanate, and the like (2) Nonlead compounds such as barium titanate, barium strontium titanate, bismuth sodium titanate, bismuth potassium titanate, sodium niobate, potassium niobate, lithium niobate, and the like It is further preferable that the piezoelectric film 14 contain metal ions of one or more of Mg, Ca, Sr, Ba, Bi, Nb, Ta, W, Ln, and the like, where Ln represents the lanthanide elements (i.e., La, Ce, Pr, Nd, Sm, Eu, Gd, Tb, Dy, Ho, Er, Tm, Yb, and Lu).

In the present embodiment, the piezoelectric film 14 contains ferroelectric phases of one or more of the following three types I, II, and III.

In the ferroelectric phase of the type I, the direction of the applied electric field and a normal of a plane determined by the spontaneous-polarization axis and the [010] axis makes an angle θm satisfying the condition that −45 degrees<θm<+45 degrees and θm≠0 degrees.

In the ferroelectric phase of the type II, the spontaneous-polarization axis is perpendicular to the direction of the applied electric field, and the direction of the applied electric field and a normal of a plane determined by the spontaneous-polarization axis and the [010] axis makes an angle Sm satisfying the condition that −45 degrees<θm<+45 degrees and θm≠0 degrees.

In the ferroelectric phase of the type III, the [010] axis is perpendicular to the direction of the applied electric field, and the direction of the applied electric field and a normal of a plane determined by the spontaneous-polarization axis and the [010] axis makes an angle θm satisfying the condition that −45 degrees<θm<+45 degrees and θm≠0 degrees.

The ferroelectric phases of the types I, II, and III realize domains in which the polarization axis can reversibly rotate by an angle different from 180 degrees in response to increase or decrease in the strength of the applied electric field.

Further, in the ferroelectric phases of the types I, II, and III, it is particularly preferable that the tilt angle θm, from the direction of the applied electric field, of the normal of the plane determined by the spontaneous-polarization axis and the [010] axis satisfy the additional condition that −20 degrees<θm<+20 degrees.

Although the crystal systems of the above ferroelectric phases are not specifically limited, the possible crystal systems depend on the composition of the piezoelectric film 14. For example, the crystal systems of the above ferroelectric phases may be a tetragonal crystal (having the [001] axis as the spontaneous-polarization axis), an orthorhombic crystal (having the [110] axis as the spontaneous-polarization axis), a rhombohedral crystal (having the [111] axis as the spontaneous-polarization axis) or a mixed crystal of two or more of these crystals.

Figure 2A:
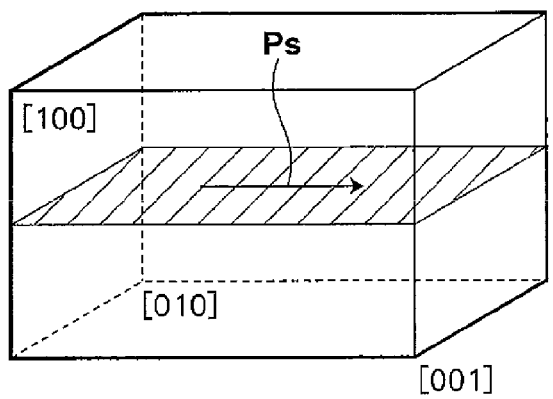
FIG. 2A is a diagram schematically illustrating the shape of a unit cell, a spontaneous-polarization axis, and a plane determined by the spontaneous-polarization axis and the [010] axis in a tetragonal crystal.
Figure 2B:
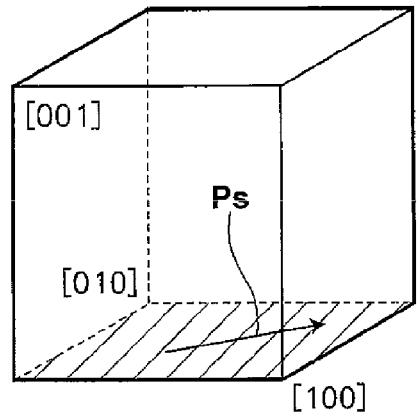
FIG. 2B is a diagram schematically illustrating the shape of a unit cell, a spontaneous-polarization axis, and a plane determined by the spontaneous-polarization axis and the [010] axis in an orthorhombic crystal.
Figure 2C:
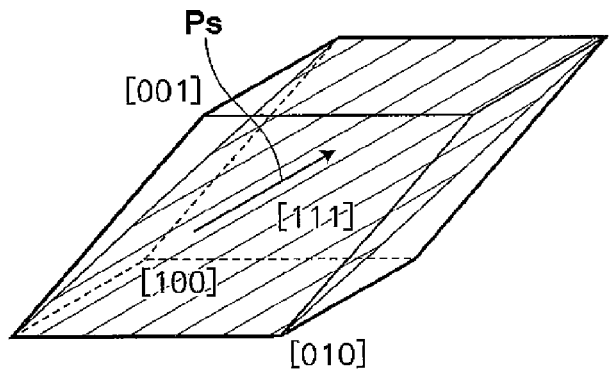
FIG. 2C is a diagram schematically illustrating the shape of a unit cell, a spontaneous-polarization axis, and a plane determined by the spontaneous-polarization axis and the [010] axis in a rhombohedral crystal.

FIGS. 2A, 2B, and 2C are diagrams schematically illustrating the shapes of unit cells, the spontaneous-polarization axes, and the planes determined by the spontaneous-polarization axis and the [010] axis in a tetragonal crystal, an orthorhombic crystal, and a rhombohedral crystal, respectively, where $P_S$ indicates the spontaneous-polarization axes. Hereinbelow, only the case where the ferroelectric phase is a tetragonal crystal is representatively explained.

In the case where the ferroelectric phases of the types I, II, and III are a tetragonal crystal, reversible 90-degree domain rotation occurs. Although the domain having a spontaneous-polarization axis along a direction perpendicular to the direction of the applied electric field corresponds to the normal a-domain, the ferroelectric phases of the types I, II, and III have tilted domain structures, which contains domains tilted from the attitude of the normal a-domain. In this specification, the attitude of each domain is defined by the orientations of the crystal axes of the domain.

Figure 3:
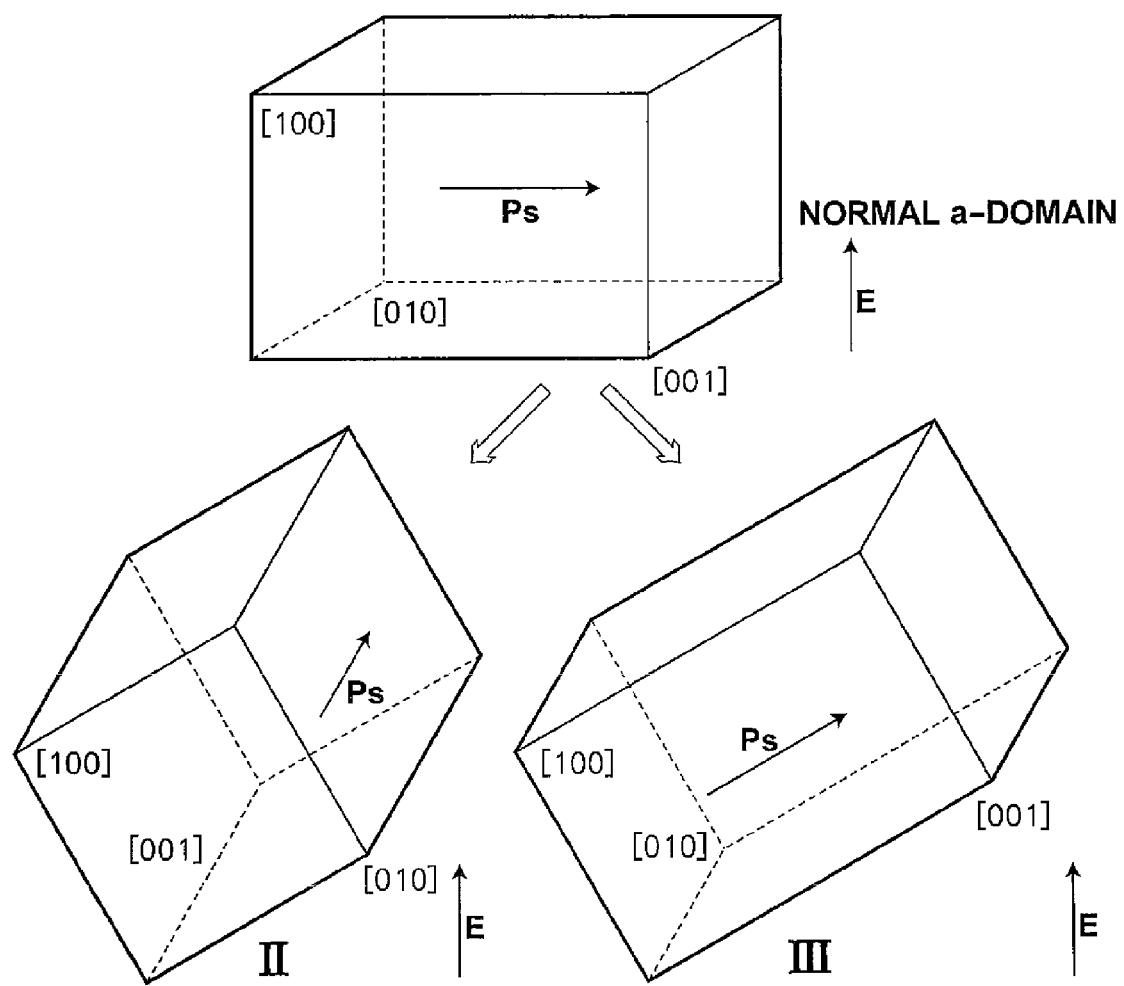
FIG. 3 is a diagram schematically illustrating a unit cell in a tetragonal crystal, and examples of tilts from the attitude of the normal a-domain.

In the case where the ferroelectric phase of the type II is the tetragonal crystal, the c-axis (i.e., the [001] axis) as the spontaneous-polarization axis is not tilted from the c-axis of the normal a-domain, and the a-axis (i.e., the [100] axis) and the b-axis (i.e., the [010] axis) are tilted from the a-axis and the b-axis of the normal a-domain. On the other hand, in the case where the ferroelectric phase of the type III is the tetragonal crystal, the b-axis (i.e., the [010] axis) as the spontaneous-polarization axis is not tilted from the b-axis of the normal a-domain, and the a-axis (i.e., the [100] axis) and the c-axis (i.e., the [001] axis) are tilted from the a-axis and the c-axis of the normal a-domain. The tilts of the ferroelectric phases of the types II and III from the attitude of the normal a-domain are schematically illustrated in FIG. 3.

As described above, two crystal axes are tilted from the corresponding crystal axes of the normal a-domain in each of the ferroelectric phases of the types II and III in the case where the ferroelectric phase is a tetragonal crystal. The ferroelectric phase of the type I includes the ferroelectric phases of the types II and III and another type realizing a tilted domain structure in which all of the a-, b-, and c-axis are tilted from the a-, b-, and c-axis of the normal a-domain.

As aforementioned before, the nonpatent references 2 and 3 disclose only the tilted domain structure in which the spontaneous-polarization axis (the c-axis) is perpendicular to the direction along which the electric field is applied, and is not tilted from the c-axis of the normal a-domain, and the a-axis and the b-axis are tilted from the a-axis and the b-axis of the normal a-domain.

Next, the reversible non-180-degree domain rotation is representatively explained below for an exemplary case where the ferroelectric phase is a tetragonal crystal. The explanation is made with reference to FIGS. 4A, 4B, and 4C in relation to the domain structure, the spontaneous-polarization axis, and the direction of the applied electric field. FIG. 4A schematically shows the conventional field-induced strain in a system in which the reversible non-180-degree domain rotation does not occur, and only the conventional field-induced strain is produced. FIG. 4B schematically shows an example of piezoelectric strain produced in a system in which the reversible non-180-degree domain rotation as disclosed in JP2004-363557A and the nonpatent references 1 occurs. FIG. 4C schematically shows an example of piezoelectric strain produced in a system having the ferroelectric phase of the type III according to the present invention in which the a-axis and the c-axis (as the spontaneous-polarization axis) are tilted by the angle θm from the a-axis and the c-axis of the normal a-domain. In FIGS. 4A, 4B, and 4C, each of the rectangles indicated by bold lines represents a unit cell in a tetragonal crystal, the arrow E indicates the direction of the applied electric field, the arrow $P_S$ indicates the direction of the spontaneous-polarization axis (i.e., the direction of the polarization when no electric field is applied), and the arrow $P_E$ indicates the direction of the polarization axis (i.e., the direction of the polarization when the electric field is applied).

When the electric field (E>0) is applied to a c-domain (i.e., a (001)-oriented domain) along the spontaneous-polarization axis of the c-domain, the c-domain expands along the direction of the applied electric field as illustrated in FIG. 4A. This is the conventional field-induced strain. In the system illustrated in FIG. 4A, the c-axis of the c-domain is oriented along the direction of the applied electric field, and both of the spontaneous-polarization axis and the applied electric field are oriented along the [001] direction (i.e., the c-axis).

When the electric field (E>0) is applied to an a-domain (i.e., a (100)-oriented domain) the a-axis of which is oriented along the direction of the applied electric field as illustrated in the left part of FIG. 4B, the a-domain rotates 90 degrees so as to become a c-domain the c-axis of which is oriented along the direction of the applied electric field as illustrated in the right part of FIG. 4B. Since the long axis of the unit cell rotates 90 degrees in this case, it is possible to produce greater piezoelectric strain than the conventional field-induced strain illustrated in the right part of FIG. 4A. In the system illustrated in FIG. 4B, the spontaneous-polarization axis is oriented along the [001] direction (the c-axis), and the direction along which the electric field is initially applied to the a-domain is the [100] direction (the a-axis).

When no electric field is applied to the domain tilted as illustrated in the left part of FIG. 4C, the a-axis and the c-axis (as the spontaneous-polarization axis) of the domain are tilted by an angle θm from the a-axis and the c-axis of the normal a-domain arranged as illustrated in the left part of FIG. 4B, where the angle θm satisfies the condition that −45 degrees<θm<+45 degrees and θm≠0 degrees. When the electric field (E>0) is applied to the tilted domain along a direction perpendicular to the surface of the substrate, the above domain tilted by the angle θm from the normal a-domain rotates 90 degrees so as to become a domain which is tilted by the angle θm from the normal c-domain as illustrated in the right part of FIG. 4C.

Since the domain as illustrated in the left part of FIG. 4C is slightly tilted from the normal a-domain arranged as illustrated in the left part of FIG. 4B, it is possible to consider that the reversible non-180-degree domain rotation is more easily occur in the domain tilted as illustrated in the left part of FIG. 4C than in the normal a-domain (the spontaneous-polarization axis of which is perpendicular to the direction of the applied electric field as illustrated in the left part of FIG. 4B).

In addition, since the spontaneous-polarization axis of the domain tilted as illustrated in the left part of FIG. 4C has a vector component in the direction of the applied electric field, the conventional field-induced strain along the direction of the spontaneous-polarization axis is also produced, and the polarization axis of the domain tilted as illustrated in the left part of FIG. 4C can more easily extend in the direction of the applied electric field than the polarization axis of the normal a-domain arranged as illustrated in the left part of FIG. 4B.

Therefore, it is possible to consider that the reversible non-180-degree domain rotation can occur in the domain tilted as illustrated in the left part of FIG. 4C at lower strength of the applied electric field than in the normal a-domain arranged as illustrated in the left part of FIG. 1B, so that the piezoelectric strain due to the reversible non-180-degree domain rotation can be more efficiently produced in the domain tilted as illustrated in the left part of FIG. 1C than in the normal a-domain arranged as illustrated in the left part of FIG. 4B.

Because of the above reasons, the domain illustrated in the left part of FIG. 4C can have a greater piezoelectric constant than the normal c-domain arranged as illustrated in the left part of FIG. 4A or the normal a-domain arranged as illustrated in the left part of FIG. 4B.

Alternatively, it is possible to form a tilted domain structure in which the b-axis (instead of the a-axis) and the c-axis (as the spontaneous-polarization axis) of the domain are tilted by an angle θm from the b-axis and the c-axis of the normal a-domain arranged as illustrated in the left part of FIG. 4B. Even in this case, it is possible to achieve piezoelectric performance similar to the domain illustrated in the left part of FIG. 4C.

Further, the present inventors have found that the reversible non-180-degree domain rotation can also more easily occur in the tilted domain of the ferroelectric phase of the type II than in the normal a-domain as illustrated in the left part of FIG. 4B. In the ferroelectric phase of the type II, the c-axis (as the spontaneous-polarization axis) of the domain of the ferroelectric phase of the type II is not tilted from the c-axis of the normal a-domain, and both of the a-axis and the b-axis are tilted from the a-axis and the b-axis of the normal a-domain. The present inventors consider that the reversible non-180-degree domain rotation can more easily occur in the tilted domains of the ferroelectric phase of the type II or the type III (regardless of whether or not the spontaneous-polarization axis of the tilted domain is tilted from the spontaneous-polarization axis of the normal a-domain) than in the normal a-domain (not tilted) as illustrated in the left part of FIG. 4B.

The ferroelectric phase of the type I includes the ferroelectric phases of the types II and III, and ferroelectric phases of another type realizing a tilted domain in which all of the a-, b-, and c-axis are tilted from the a-, b-, and c-axis of the normal a-domain. Therefore, the reversible non-180-degree domain rotation can more easily occur in the tilted domains of the ferroelectric phase of the type I than in the normal (not tilted) a-domain as illustrated in the left part of FIG. 4B for similar reasons to the ferroelectric phases of the types II and III.

In the piezoelectric film 14, the orientations, with respect to the direction of the applied electric field, of the normals of the planes determined by the spontaneous-polarization axes and the [010] axes, and/or the tilt angles θm of the normals from the direction of the applied electric field may vary and have a distribution. The oriented crystalline films are examples of piezoelectric films having such a distribution. Mostly, the oriented crystalline films are monoaxially-oriented films, and it is possible to realize oriented crystalline films in which the orientations, with respect to the direction of the applied electric field, of the normals of the planes determined by the spontaneous-polarization axes and the [010] axes have a distribution although the tilt angles θm of the normals from the direction of the applied electric field are approximately identical.

However, in the piezoelectric film 14, the orientations, with respect to the direction of the applied electric field, of the normals of the planes determined by the spontaneous-polarization axes and the [010] axes, as well as the tilt angles θm of the normals from the direction of the applied electric field, may also be approximately identical. The epitaxial films are examples of the films in which the orientations, with respect to the direction of the applied electric field, of the normals of the planes determined by the spontaneous-polarization axes and the [010] axes, as well as the tilt angles θm of the normals from the direction of the applied electric field, are also approximately identical.

In the case where the piezoelectric film 14 is an oriented crystalline film or an epitaxial film, it is possible to stably obtain a tilted domain structure as designed. Therefore, the piezoelectric film 14 is preferably an oriented crystalline film or an epitaxial film.

Hereinbelow, the characteristics and the composition of the substrate 11, the buffer layer 12, the lower electrode 13, and the upper electrode 15 are representatively explained for an exemplary case where the piezoelectric film 14 is an epitaxial film.

In the case where the piezoelectric film 14 is an epitaxial film, it is necessary that the substrate 11 be a monocrystalline substrate, and it is preferable that the surface of the monocrystalline substrate be tilted by the angle θs from a low-index face of the monocrystalline substrate, and the angle θs satisfies the condition that −45 degrees<θs<+45 degrees and θs≠0 degrees. Further, in this case, it is possible to produce the piezoelectric film 14 so as to have a structure in which the tilt angle θs from the low-index face is identical to the angle θm between the thickness direction (i.e., the direction of the applied electric field) and the normal of the plane determined by the spontaneous-polarization axis and the [010] axis. Furthermore, in order to realize epitaxial growth of the piezoelectric film 14, it is preferable that the buffer layer 12 and the lower electrode 13 be epitaxial films.

For example, a desirable monocrystalline substrate can be produced by preparing a monocrystalline substrate (e.g., a (100) monocrystalline substrate) the surface of which is a low-index face, and cutting off the monocrystalline substrate along a plane which makes the angle θs with the low-index face, where the angle θs satisfies the condition that −45 degrees<θs<+45 degrees and θs≠0 degrees. When the substrate 11 produced as above is used, it is possible to epitaxially grow the buffer layer 12, the lower electrode 13, and the piezoelectric film 14, and the upper electrode 15 so that the buffer layer 12, the lower electrode 13, and the piezoelectric film 14, and the upper electrode 15 have crystal faces which are tilted similarly to the substrate 11.

The orientations of the spontaneous-polarization axes are low-index directions regardless of the crystal system(s) of the piezoelectric film 14. Therefore, when the substrate 11 is the monocrystalline substrate having the surface tilted by the angle θs satisfying the condition that −45 degrees<θs<+45 degrees and θs≠0 degrees, it is possible to form the piezoelectric film 14 so as to contain ferroelectric phases of at least one of the aforementioned types I, II, and III. For example, in the system illustrated in FIG. 4C, the substrate surface may be the face which is tilted by the angle θs from the (100) face.

In the case where the substrate 11 is a monocrystalline substrate, and the buffer layer 12, the lower electrode 13, and the piezoelectric film 14, and the upper electrode 15 formed over the substrate 11 are epitaxial films, the compositions of the buffer layer 12, the lower electrode 13, and the piezoelectric film 14, and the upper electrode 15 are determined so that the buffer layer 12, the lower electrode 13, and the piezoelectric film 14, and the upper electrode 15 approximately lattice-match with the substrate 11.

The monocrystalline substrate may be formed of silicon, oxide (e.g., $SrTiO_3$), or the like.

The buffer layer 12 is provided for improving the lattice matching of the buffer layer 12, the lower electrode 13, and the piezoelectric film 14, and the upper electrode 15 with the substrate 11. Although the thickness of the buffer layer 12 is not specifically limited, the thickness of the buffer layer 12 is preferably 1 to 100 nm.

Although the main components of the lower electrode 13 and the upper electrode 15 are not specifically limited, the main components may be one or a combination of metals and metal oxides which are conductive. Although the thicknesses of the lower electrode 13 and the upper electrode 15 are not specifically limited, the thicknesses of the lower electrode 13 and the upper electrode 15 are preferably 50 to 5000 nm, and particularly preferably 100 to 500 nm.

Although the thickness of the piezoelectric film 14 is not specifically limited, it is preferable that the thickness of the piezoelectric film 14 be small since the size and weight reduction in the piezoelectric devices are currently being pursued in correspondence with the decrease in the size and weight of the electronic devices. In addition, improvement of the functions of the piezoelectric devices are also being pursued in correspondence with the sophistication of the functions of the electronic devices. Thus, in consideration of the thickness reduction in the piezoelectric film 14, the stability of the film formation, the piezoelectric performance, and the like, the thickness of the piezoelectric film 14 is preferably 10 nm to 100 μm, and particularly preferably 100 nm to 20 μm.

The material preferable for the piezoelectric film 14 is, for example, $BaTiO_3$ or the like, since it is easy to realize in a film of $BaTiO_3$ a structure in which reversible non-180-degree domain rotation can occur. In addition, since $BaTiO_3$ does not contain lead, the use of $BaTiO_3$ is preferable from the viewpoint of environment.

An example of a combination of materials for the substrate 11, the buffer layer 12, the lower electrode 13, the piezoelectric film 14, and the upper electrode 15 which realizes satisfactory lattice matching in the case where the substrate 11 is a monocrystalline substrate of silicon and the piezoelectric film 14 is formed of $BaTiO_3$ is indicated below.

In this example, the substrate 11 is a monocrystalline substrate of silicon having a lattice constant of 5.431 angstroms, the main component of the buffer layer 12 is one or a combination of oxides having a fluorite structure such as stabilized zirconia or cerium oxide, the main component of the lower electrode 13 is one or a combination of conductive metal oxides (such as $SrRuO_3$, $LaNiO_3$, and $YBa_2Cu_3O_x$) each containing at least one rare-earth element, the main component of the piezoelectric film 14 is $BaTiO_3$ having the lattice constants, a=b=3.99 angstroms and c=4.03 angstroms, and the main component of the upper electrode 15 is Pt, Pt/Ti, Au, Au/Cr, $SrRuO_3$, or the like.

In the above example, the film-formation temperature of the buffer layer 12 is preferably 600° C. or higher, and particularly preferably 700° C. to 800° C., the film-formation temperature of the lower electrode 13 is preferably 600° C. or higher, and particularly preferably 650° C. to 750° C., the film-formation temperature of the piezoelectric film 14 is preferably 450° C. or higher, and particularly preferably 500° C. to 700° C., and the film-formation temperature of the upper electrode 15 is preferably the room temperature or higher, and particularly preferably 100° C. to 300° C.

As mentioned before in the "Description of the Related Art," the conventional piezoelectric bodies taking advantage of the reversible non-180-degree domain rotation are bulk monocrystals or bulk ceramics, and neither the piezoelectric film taking advantage of the reversible non-180-degree domain rotation nor a process for producing such a piezoelectric film are conventionally known. For example, in the tilted domain structures disclosed in the nonpatent references 2 and 3, the c-axis as the spontaneous-polarization axis is not tilted from the c-axis of the normal a-domain, and the a-axis and the b-axis are tilted from the a-axis and the b-axis of the normal a-domain. However, the nonpatent references 2 and 3 disclose neither the piezoelectric film having the above tilted domain structure nor a process for producing such a piezoelectric film. That is, the piezoelectric film having the aforementioned tilted domain structure according to present invention and the process for producing such a piezoelectric film according to present invention are novel.

It is basically difficult to make the non-180-degree domain rotation reversible, i.e., it is difficult to restore each domain in a piezoelectric substance to an original state from a rotated state when application of the electric field to the piezoelectric substance is stopped (after the domain is rotated by an angle different from 180 degrees from the original state). However, each domain in the piezoelectric substance can be restored to the original state more easily in the case where the piezoelectric substance is a piezoelectric film restrained by a substrate than in the case where the piezoelectric substance is a bulk piezoelectric body.

In particular, in the case where thermal expansion coefficient of the piezoelectric film 14 is greater than the thermal expansion coefficient of the substrate 11 in the temperature range from room temperature to 500° C., each domain is relatively easily restored to the original state from the rotated state when application of the electric field to the piezoelectric substance is stopped after the rotation. For example, the linear expansion coefficient of silicon (which is a material suitable for the substrate) in the temperature range from room temperature to 500° C. is $2.6 \times 10^{-6}$ $K^{-1}$, and the linear expansion coefficients of the common piezoelectric materials are $4.0 \times 10^{-6}$ to $8.0 \times 10^{-6}$ $K^{-1}$.

The reason for the relative ease as above is representatively explained below with reference to FIG. 5 for an exemplary case where each domain in the piezoelectric film 14 is a tetragonal crystal.

Although the piezoelectric film 14 has a domain structure which is tilted by an angle θm from the attitude of the normal a-domain when no electric field is applied to the piezoelectric film 14, in order to simplify the explanation, it is assumed that the piezoelectric film 14 is constituted by a-domains when no electric field is applied to the piezoelectric film 14, and all the a-domains rotate so as to become c-domains when an electric field is applied to the piezoelectric film 14. In FIG. 5, the reference numbers 14a denotes a-domains, 14c denotes c-domains, and the electrodes are not indicated for simple illustration.

In the case where thermal expansion coefficient of the piezoelectric film 14 is greater than the thermal expansion coefficient of the substrate 11 in the temperature range from room temperature to 500° C., the piezoelectric film 14 laterally contracts by a relatively greater amount than the substrate 11 when the temperature of the piezoelectric film 14 and the substrate 11 is lowered to room temperature after formation of the piezoelectric film 14 over the substrate 11, because of the difference in thermal expansion coefficients between the piezoelectric film 14 and the substrate 11. Although the amount of the contraction of the piezoelectric film 14 relative to the substrate 11 is very small, the difference in the thermal expansion coefficient between the piezoelectric film 14 and the substrate 11 causes tensile stress in the piezoelectric film 14 as illustrated in the upper part of FIG. 5. In the ferroelectric crystals (as anisotropic crystals), the crystal structures are relatively stable when the long axis is aligned with the direction of the tensile stress since the tensile stress is moderated by the alignment. Therefore, the normal a-domains are crystallographically stable when the temperature of the piezoelectric film 14 and the substrate 11 is lowered to room temperature after formation of the piezoelectric film 14 over the substrate 11. Thus, it is possible to consider that reversible non-180-degree domain rotation can stably occur in the piezoelectric film restrained by the substrate as above since the c-domains produced by domain rotation from a-domains which is caused by application of an electric field can be easily restored to the a-domains (in which the long axis is aligned with the direction of the tensile stress and which are crystallographically stable) when the application of the electric field is stopped. Even in the case where domains are tilted by the angle θm before the electric field is applied to the piezoelectric film, reversible non-180-degree domain rotation can stably occur in a basically similar manner when the piezoelectric film 14 is restrained by the substrate 11.

The piezoelectric film 14 having the tilted domain structure according to the present invention can be formed by oblique-incidence evaporation, which can be realized by arranging the substrate oblique to a target in a sputtering system. When the oblique-incidence evaporation is used, columnar crystals obliquely grow, so that an obliquely oriented film is formed.

In addition, when the lattice misfit is appropriately controlled, it is possible to grow a high-index face over a low-index-face substrate such as the (100) substrate, and form the piezoelectric film 14 having the tilted domain structure.

Further, the piezoelectric film 14 according to the present embodiment constituted by domains of one or more of the ferroelectric phases of the types I, II, and III may also contain one or more other types of domains including, for example, the domains illustrated in FIGS. 4A and 4B, the domains in an engineered-domain structure which are proposed in the International Patent Publication No. WO2007/034903 (corresponding to Japanese Patent Application No. 2006-188765, the inventors of which include one of the present inventors, Yukio Sakashita). In the engineered-domain structure proposed in the International Patent Publication No. WO2007/034903, field-induced phase transition occurs. When the piezoelectric film 14 is constituted as above, various piezoelectric effects are produced.

As explained above, the piezoelectric film 14 according to the present embodiment is constituted by domains of the ferroelectric phases of one or more of the types I, II, and III, which realize domains in which the polarization axis can reversibly rotate by an angle different from 180 degrees in response to increase or decrease in the strength of the applied electric field applied to the piezoelectric film 14.

Since, in the ferroelectric phases of the types I, II, and III, the normal of a plane determined by the spontaneous-polarization axis and the [010] axis is tilted from the direction of the applied electric field by the angle θm satisfying the condition that −45 degrees<θm<+45 degrees and θm≠0 degrees, the reversible non-180-degree domain rotation can occur more effectively in the piezoelectric film 14 according to the present invention than the conventional piezoelectric films in which the normal of a plane determined by the spontaneous-polarization axis and the [010] axis is perpendicular to the direction of the applied electric field. Therefore, the piezoelectric film 14 in the piezoelectric device 1 according to the present invention exhibits high piezoelectric performance.

2. Inkjet Recording Apparatus

Figure 6:
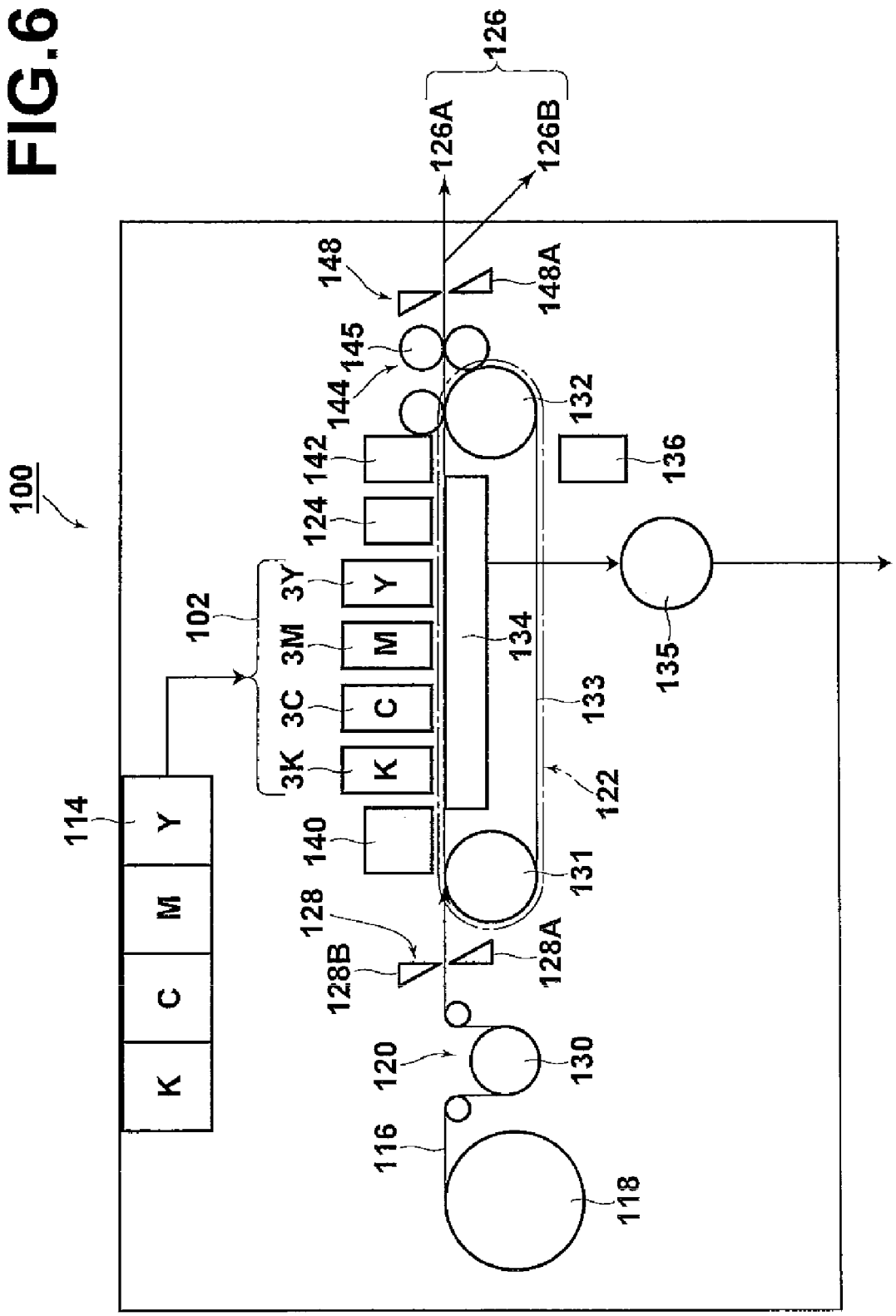
FIG. 6 is a diagram schematically illustrating an example of an inkjet recording apparatus having the inkjet recording head of FIG. 1.
Figure 7:
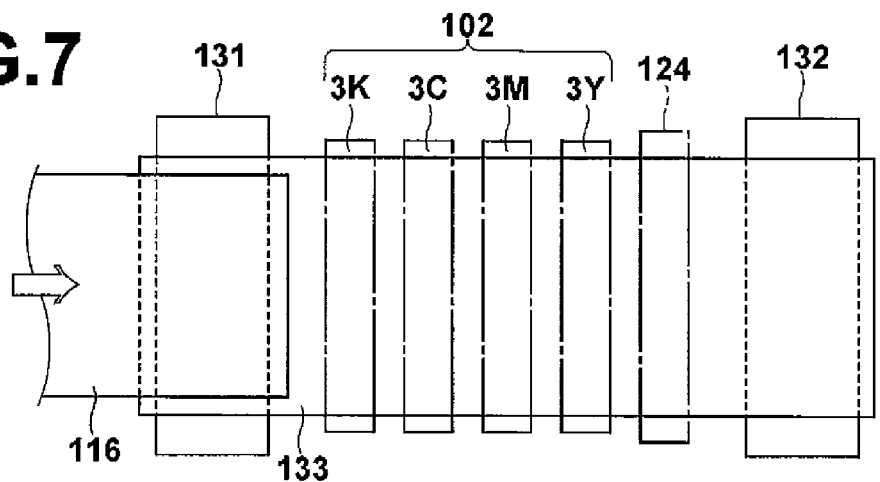
FIG. 7 is a top view of a portion of the inkjet recording apparatus of FIG. 6.

Hereinbelow, an example of an inkjet recording apparatus having the inkjet recording head 3 is explained with reference to FIGS. 6 and 7. FIG. 6 is a schematic diagram illustrating an outline of an example of an inkjet recording apparatus having the inkjet recording head 3 of FIG. 1, and FIG. 7 is a top view of a portion of the inkjet recording apparatus of FIG. 6.

As schematically illustrated in FIG. 6, the inkjet recording apparatus 100 comprises a printing unit 102, an ink reserve-and-load unit 114, a sheet feeding unit 118, a decurling unit 120, a suction-type belt conveyer 122, a print detection unit 124, and a sheet output unit 126. The printing unit 102 comprises a plurality of inkjet recording heads 3K, 3C, 3M, and 3Y corresponding to inks of different colors (specifically, black (K), cyan (C), magenta (M), and yellow (Y)). Hereinafter, the inkjet recording heads may be referred to as heads. The ink reserve-and-load unit 114 reserves the inks to be supplied to the heads 3K, 3C, 3M, and 3Y. The sheet feeding unit 118 feeds a recording sheet 116. The decurling unit 120 eliminates curl of the recording sheet 116. The suction-type belt conveyer 122 is arranged to face the nozzle faces (ink-discharge faces) of the printing unit 102, and conveys the recording sheet 116 while maintaining the flatness of the recording sheet 116. The print detection unit 124 reads an image printed on the recording sheet 116 by the printing unit 102. The sheet output unit 126 externally outputs a printed recording sheet 116.

Each of the heads 3K, 3C, 3M, and 3Y constituting the printing unit 102 corresponds to the inkjet recording head according to the present embodiment as explained before, although, in order to realize a linear head (explained later), each inkjet recording head used in the inkjet recording apparatus 100 comprises a plurality of piezoelectric devices on the lower electrode 13, and a plurality of ink chambers and a plurality of ink outlets are arranged in correspondence with the arrangement of the plurality of piezoelectric devices on the lower electrode 13.

The decurling unit 120 performs decurling of the recording sheet 116 by heating the recording sheet 116 with a heating drum 130 so as to eliminate the curl produced in the sheet feeding unit 118.

In the case where the inkjet recording apparatus 100 uses roll paper, a cutter 128 for cutting the roll paper into desired size is arranged in the stage following the decurling unit 120. The cutter 128 is constituted by a fixed blade 128A and a round blade 128B. The fixed blade 128A has a length equal to or greater than the width of the conveying path of the recording sheet 116, and is arranged on the side opposite to the print side of the recording sheet 116. The round blade 128B is arranged opposite to the fixed blade 128A on the print side of the recording sheet 116, and moves along the fixed blade 128A. In the inkjet recording apparatuses using cut paper, the cutter 128 is unnecessary.

After the roll paper is decurled and cut into the recording sheet 116, the recording sheet 116 is transferred to the suction-type belt conveyer 122. The suction-type belt conveyer 122 is constituted by rollers 131 and 132 and an endless belt 133. The rollers 131 and 132 are placed apart and the endless belt 133 is looped around the rollers 131 and 132 in such a manner that at least portions of the endless belt 133 which face the nozzle faces of the printing unit 102 and the sensor face of the print detection unit 124 are flat and horizontal.

The endless belt 133 has a width greater than the width of the recording sheet 116, and a great number of suction pores (not shown) are formed through the endless belt 133. A suction chamber 134 is arranged inside the loop of the endless belt 133 at the position opposite to the nozzle faces of the printing unit 102 and the sensor face of the print detection unit 124, and suctioned by a fan 135, so that a negative pressure is generated in the suction chamber 134, and the recording sheet 116 on the endless belt 133 is held by suction.

The power of a motor (not shown) is transmitted to at least one of the rollers 131 and 132 so that the endless belt 133 is driven clockwise in FIG. 6, and the recording sheet 116 held on the endless belt 133 is moved from left to right in FIG. 6.

In the case of borderless printing, ink can be deposited on the endless belt 133. Therefore, in order to clean the endless belt 133, a belt cleaning unit 136 is arranged at a predetermined (appropriate) position outside the loop of the endless belt 133 and the printing region.

A heating fan 140 is arranged on the upstream side of the printing unit 102 above the conveying path of the recording sheet 116 (which is realized by the suction-type belt conveyer 122). The heating fan 140 blows heated air to the recording sheet 116 before printing so as to heat the recording sheet 116 and facilitate drying of deposited ink.

Each of the heads 3K, 3C, 3M, and 3Y in the printing unit 102 is a so-called full-line type head, which is a linear head having a length corresponding to the maximum width of the recording sheet 116, and being arranged across the width of the recording sheet 116 (i.e., in the main scanning direction perpendicular to the feeding direction of the recording sheet 116) as illustrated in FIG. 7. Specifically, each of the heads 3K, 3C, 3M, and 3Y is a linear head in which the aforementioned plurality of ink-discharge outlets (nozzles) are arrayed over a length exceeding the maximum length of a side of the largest recording sheet 116 on which the inkjet recording apparatus 100 can print an image. The heads 3K, 3C, 3M, and 3Y corresponding to the inks of the different colors are arrayed upstream in this order along the feeding direction as illustrated in FIG. 7. Thus, a color image can be printed on the recording sheet 116 by discharging the inks of the different colors while conveying the recording sheet 116.

The print detection unit 124 may be constituted by, for example, a line sensor which takes an image formed of spots of the inks discharged from the printing unit 102, and detects, from the image taken by the line sensor, incomplete discharge, which can be caused by clogging of a nozzle or the like.

A rear drying unit 142 for drying the printed surface of the recording sheet 116 is arranged in the stage following the print detection unit 124. For example, the rear drying unit 142 is realized by a heating fan or the like. Since it is preferable to avoid contact with the printed surface before the ink on the printed surface is completely dried, it is preferable that the rear drying unit 142 dry the ink on the printed surface by blowing heated air.

In order to control the glossiness of the image printed on the recording sheet 116, a heating-and-pressurizing unit 144 is arranged in the stage following the rear drying unit 142. The heating-and-pressing unit 144 comprises a pressure roller 145 with a surface having predetermined projections and depressions, and transfers the predetermined projections and depressions to the printed surface of the recording sheet 116 by pressing the printed surface with the pressure roller 145 while heating the printed surface.

Finally, the printed recording sheet 116 produced as above is outputted from the sheet output unit 126. It is preferable to separately output test prints and prints for practical use. Therefore, the sheet output unit 126 includes a first output unit 126A for the prints for practical use and a second output unit 126B for the test prints. Although not shown, the inkjet recording apparatus 100 further comprises a sorting unit which sorts the printed recording sheets 116 into the test prints and the prints for practical use, and sends the test prints to the first output unit 126B, and the prints for practical use to the second output unit 126A.

Further, in the case where both of a test image and an image for practical use are concurrently printed on a recording sheet 116, it is possible to arrange a cutter 148, and separate a first portion of the recording sheet 116 on which the test image is printed and a second portion of the recording sheet 116 on which the image for practical use is printed.

3. Concrete Examples of the Present Invention

The present inventors have produced a concrete example of the piezoelectric device according to the present invention and a comparison example of the conventional piezoelectric device as indicated below.

3.1 Concrete Example

The concrete example of the piezoelectric device according to the present invention has been produced in accordance with the following procedure.

First, a monocrystalline substrate of silicon with a surface on which a thermally-oxidized film having a thickness of 300 nm is formed is prepared. Then, an adhesion layer of titanium having 20 nm and a lower electrode of platinum having a thickness of 200 nm are formed in this order on the above thermally-oxidized film by sputtering at the substrate temperature of 300° C.

Subsequently, a piezoelectric film of Nb-doped PZT having a thickness of 4 micrometers is formed by sputtering at the substrate temperature of 550° C. Thereafter, an upper electrode of platinum having a thickness of 200 nm is formed on the piezoelectric film by sputtering at room temperature. Thus, production of the concrete example of the piezoelectric device according to the present invention is completed.

Next, the back surface of the substrate is patterned by ICP-RIE (inductively-coupled-plasma reactive-ion etching) using a mask of aluminum, and the substrate is processed so as to produce an ink nozzle having a diaphragm, an ink chamber, and an ink-discharge outlet, where the ink chamber has the dimensions of 300×300 micrometers. Thus, production of an inkjet recording head having the concrete example of the piezoelectric device according to the present invention is completed.

3.2 Measurement of Concrete Example

The present inventors have performed composition analysis of the piezoelectric film in the concrete example by X-ray fluorescence (XRF) measurement, and the molar ratios have been obtained as follows.

$Zr/(Zr+Ti)=0.48$ $Nb/(Zr+Ti+Nb)=0.1$ $Pb/(Zr+Ti+Nb)=1.1$

The present inventors have performed X-ray diffraction (XRD) measurement of the piezoelectric film in the concrete example, and the result of the XRD measurement shows that the piezoelectric film in the concrete example is (100) oriented, and has an MPB (morphotropic phase boundary) composition.

Figure 8A:
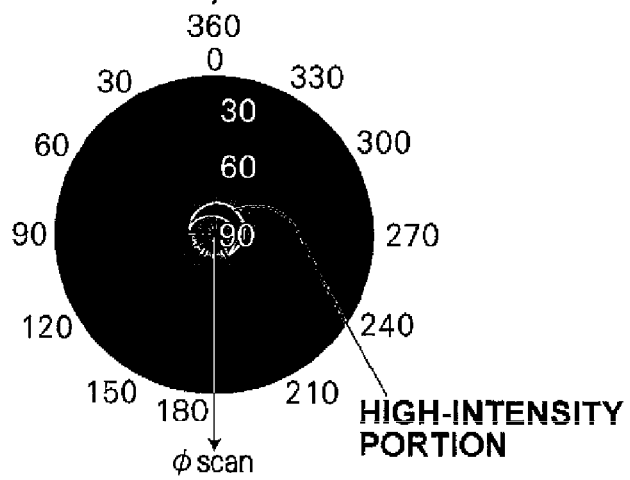
FIG. 8A is an example of a pole figure of a piezoelectric film of a concrete example.
Figure 8B:
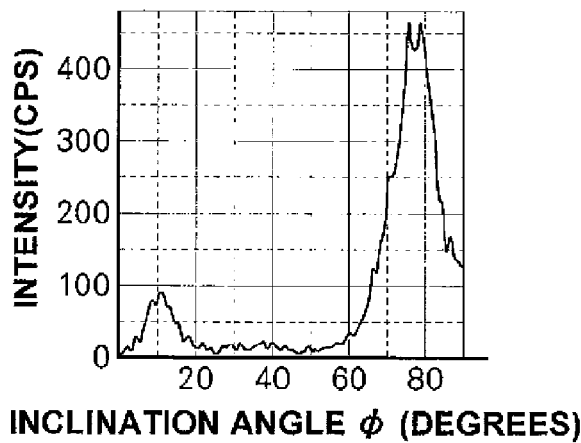
FIG. 8B is an example of a Φ scan profile of the piezoelectric film in the concrete example.

In addition, in order to analyze the orientation of the piezoelectric film, the present inventors have performed pole figure measurement. FIG. 8A is an example of a pole figure of the (200) faces (i.e., a (200) pole figure) in the piezoelectric film in the concrete example, and FIG. 8B is an example of a D scan profile (i.e., a cross section) of the (200) pole figure of the piezoelectric film in the concrete example.

The orientations corresponding to relatively high XRD intensities are observed as a ring in the pole figure of FIG. 8A. That is, the pole figure of FIG. 5A shows that the piezoelectric film in the concrete example is an obliquely grown film in which the orientation of the piezoelectric film is tilted from the complete (100) orientation. Further, the intensities at the various positions in the ring vary, and the portion at which the intensity is maximized is highlighted in FIG. 8A. The Φ scan profile of FIG. 8B shows a peak in the range of the angle Φ from 75 to 80 degrees, and the half width of the peak is 10 to 15 degrees. That is, the Φ scan profile of FIG. 8B shows that (100) faces in the piezoelectric film are tilted from the direction of the applied electric field by the angles of 10 to 15 degrees.

Figure 9A:
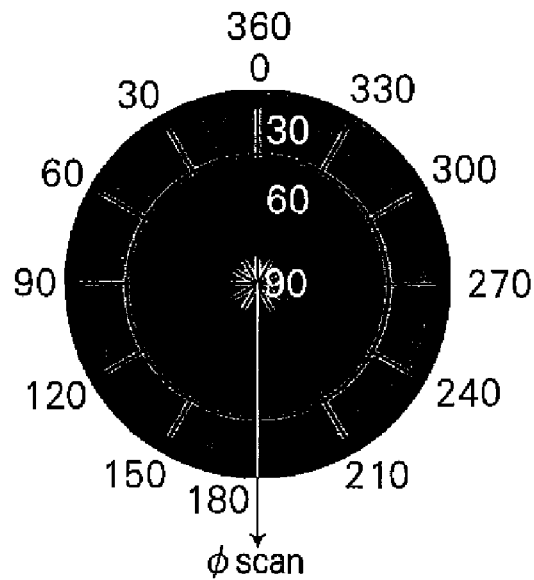
FIG. 9A is an example of a pole figure of a lower electrode in the concrete example.
Figure 9B:
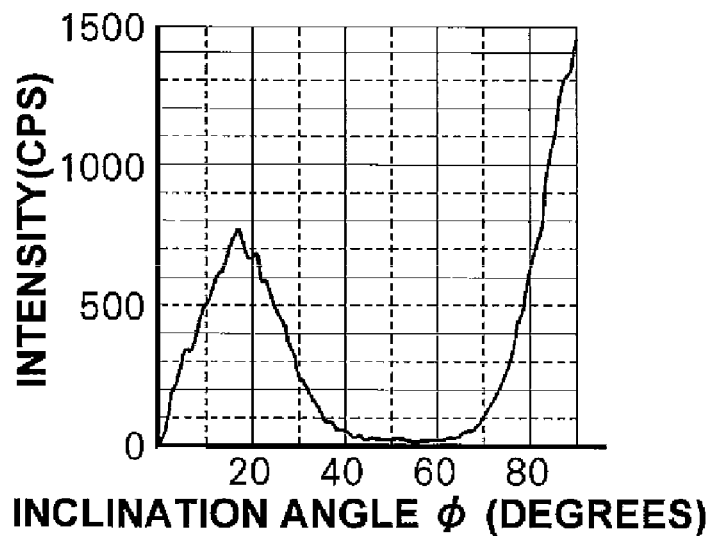
FIG. 9B is an example of a Φ scan profile of the lower electrode in the concrete example.

The present inventors have also performed similar measurement of the lower electrode, and the result of the pole figure measurement shows that the lower electrode in the concrete example is (111) oriented. FIG. 9A is an example of a pole figure of the (111) faces (i.e., a (111) pole figure) in the lower electrode in the concrete example, and FIG. 9B is an example of a Φ scan profile (i.e., a cross section) of the (111) pole figure of the lower electrode in the concrete example.

The orientations corresponding to relatively high XRD intensities are observed as a ring in the pole figure of FIG. 9A, and the intensities in the entire ring are approximately uniform. The Φ scan profile of FIG. 9B shows a peak at the angle Φ of 90 degrees, i.e., the Φ scan profile of FIG. 9B shows that the normals of the (111) faces in the piezoelectric film coincide with the direction of the applied electric field. That is, the (111) faces in the piezoelectric film are not tilted.

Further, the piezoelectric constant $d_{31}$ of the piezoelectric film in the concrete example has been measured to be 250 pm/V on the basis of the displacement.

3.3 Comparison Example

The comparison example of a piezoelectric device has been produced in a similar manner to the concrete example except that the central position of the substrate is shifted from the central position of the target in the sputtering system.

The present inventors have performed X-ray diffraction (XRD) measurement of the piezoelectric film in the comparison example, and the result of the XRD measurement shows that the piezoelectric film in the comparison example is (100) oriented, and has a tetragonal crystal structure.

Figure 10A:
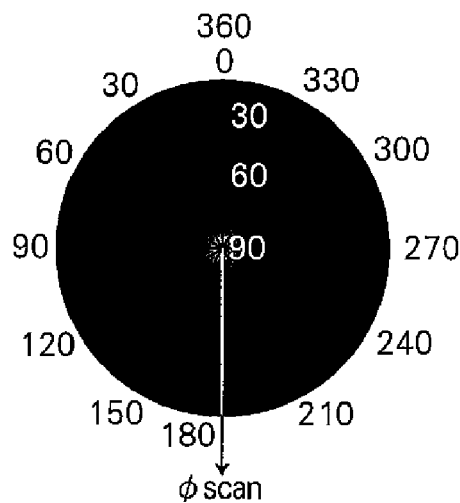
FIG. 10A is an example of a pole figure of a piezoelectric film in a comparison example.
Figure 10B:
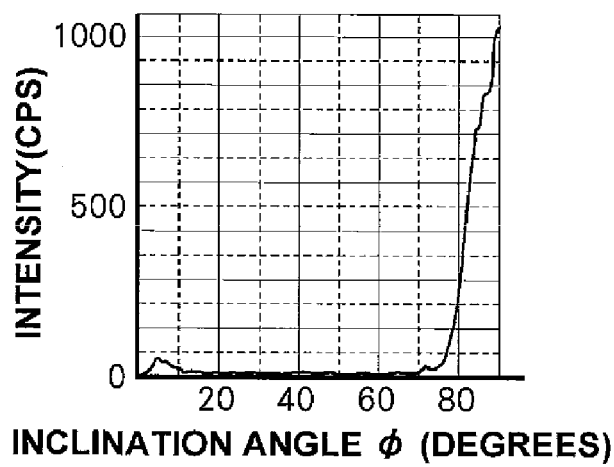
FIG. 10B is an example of a Φ scan profile of the piezoelectric film in the comparison example.

The present inventors have also performed pole figure measurement. FIG. 10A is an example of a pole figure of the (200) faces (i.e., a (200) pole figure) in the piezoelectric film in the comparison example, and FIG. 10B is an example of a Φ scan profile (i.e., a cross section) of the (200) pole figure of the piezoelectric film in the comparison example.

The orientations corresponding to relatively high XRD intensities are observed as a ring in the pole figure of FIG. 10A, and the intensities in the entire ring are approximately uniform. The Φ scan profile of FIG. 10B shows a peak at the angle Φ of 90 degrees, i.e., the Φ scan profile of FIG. 10B shows that the normals of the (100) faces in the piezoelectric film in the comparison example coincide with the direction of the applied electric field. That is, the (100) faces in the piezoelectric film in the comparison example are not tilted.

Further, the piezoelectric constant $d_{31}$ of the piezoelectric film in the comparison example has been measured to be 180 pm/V on the basis of the displacement.

4. Industrial Usability

The piezoelectric devices according to the present invention can be preferably used in piezoelectric actuators and the like, where the piezoelectric actuators may be mounted in the inkjet recording heads, the magnetic recording-and-reproduction heads, MEMS (micro electromechanical systems) devices, micropumps, ultrasonic probes, and the like.

What is claimed is:

1. A piezoelectric device comprising:
    a piezoelectric film; and
    electrodes through which an electric field can be applied to the piezoelectric film along a thickness direction of the piezoelectric film;
    said piezoelectric film contains a ferroelectric phase which has a spontaneous-polarization axis and a axis, and said thickness direction and a normal of a plane determined by the spontaneous-polarization axis and the axis makes an angle θm satisfying the condition that −45 degrees<θm<+45 degrees and θm≠0 degrees.

2. A piezoelectric device comprising:
    a piezoelectric film; and
    electrodes through which an electric field can be applied to the piezoelectric film along a thickness direction of the piezoelectric film;
    said piezoelectric film contains a ferroelectric phase which has a spontaneous-polarization axis and a axis, the spontaneous-polarization axis is perpendicular to said thickness direction, and said thickness direction and a normal of a plane determined by the spontaneous-polarization axis and the axis makes an angle θm satisfying the condition that −45 degrees<θm<+45 degrees and θm≠0 degrees.

3. A piezoelectric device comprising:
    a piezoelectric film; and
    electrodes through which an electric field can be applied to the piezoelectric film along a thickness direction of the piezoelectric film;
    said piezoelectric film contains a ferroelectric phase which has a spontaneous-polarization axis and a axis, the axis is perpendicular to said thickness direction, and said thickness direction and a normal of a plane determined by the spontaneous-polarization axis and the axis makes an angle θm satisfying the condition that −45 degrees<θm<+45 degrees and θm≠0 degrees.

4. A piezoelectric device according to claim 1, wherein said piezoelectric film has crystal orientation.

5. A piezoelectric device according to claim 2, wherein said piezoelectric film has crystal orientation.

6. A piezoelectric device according to claim 3, wherein said piezoelectric film has crystal orientation.

7. A piezoelectric device according to claim 1, wherein said piezoelectric film is an epitaxial film formed over a surface of a monocrystalline substrate.

8. A piezoelectric device according to claim 2, wherein said piezoelectric film is an epitaxial film formed over a surface of a monocrystalline substrate.

9. A piezoelectric device according to claim 3, wherein said piezoelectric film is an epitaxial film formed over a surface of a monocrystalline substrate.

10. A piezoelectric device according to claim 7, wherein said surface of the monocrystalline substrate is tilted by an angle θs from a low-index face of the monocrystalline substrate, and the angle θs satisfies the condition that −45 degrees<θs<+45 degrees and θs≠0 degrees.

11. A piezoelectric device according to claim 8, wherein said surface of the monocrystalline substrate is tilted by an angle θs from a low-index face of the monocrystalline substrate, and the angle θs satisfies the condition that −45 degrees<θs<+45 degrees and θs≠0 degrees.

12. A piezoelectric device according to claim 9, wherein said surface of the monocrystalline substrate is tilted by an angle θs from a low-index face of the monocrystalline substrate, and the angle θs satisfies the condition that −45 degrees<θs<+45 degrees and θs≠0 degrees.

13. A piezoelectric device according to claim 10, wherein said angle θs from the low-index face is identical to said angle θm between the thickness direction and the normal of the plane determined by the spontaneous-polarization axis and the axis.

14. A piezoelectric device according to claim 11, wherein said angle θs from the low-index face is identical to said angle θm between the thickness direction and the normal of the plane determined by the spontaneous-polarization axis and the axis.

15. A piezoelectric device according to claim 12, wherein said angle θs from the low-index face is identical to said angle θm between the thickness direction and the normal of the plane determined by the spontaneous-polarization axis and the axis.

16. A piezoelectric device according to claim 7, wherein said electrodes are a lower electrode and an upper electrode, the lower electrode is formed between said surface of the monocrystalline substrate and said piezoelectric film, the upper electrode is formed on the piezoelectric film, and only the lower electrode or each of the lower electrode and the upper electrode is an epitaxial film.

17. A piezoelectric device according to claim 8, wherein said electrodes are a lower electrode and an upper electrode, the lower electrode is formed between said surface of the monocrystalline substrate and said piezoelectric film, the upper electrode is formed on the piezoelectric film, and only the lower electrode or each of the lower electrode and the upper electrode is an epitaxial film.

18. A piezoelectric device according to claim 9, wherein said electrodes are a lower electrode and an upper electrode, the lower electrode is formed between said surface of the monocrystalline substrate and said piezoelectric film, the upper electrode is formed on the piezoelectric film, and only the lower electrode or each of the lower electrode and the upper electrode is an epitaxial film.

19. A piezoelectric device according to claim 7, wherein said monocrystalline substrate is made of one of silicon and oxide.

20. A piezoelectric device according to claim 8, wherein said monocrystalline substrate is made of one of silicon and oxide.

21. A piezoelectric device according to claim 9, wherein said monocrystalline substrate is made of one of silicon and oxide.

22. A piezoelectric device according to claim 1, wherein said ferroelectric phase realizes a domain having a polarization axis which can reversibly rotate by an angle different from 180 degrees when said electric field is strengthened or weakened.

23. A piezoelectric device according to claim 2, wherein said ferroelectric phase realizes a domain having a polarization axis which can reversibly rotate by an angle different from 180 degrees when said electric field is strengthened or weakened.

24. A piezoelectric device according to claim 3, wherein said ferroelectric phase realizes a domain having a polarization axis which can reversibly rotate by an angle different from 180 degrees when said electric field is strengthened or weakened.

25. A piezoelectric device according to claim 1, wherein said ferroelectric phase has a structure corresponding to one of tetragonal, orthorhombic, and rhombohedral crystal systems, or a mixture of structures corresponding to two or all of the tetragonal, orthorhombic, and rhombohedral crystal systems.

26. A piezoelectric device according to claim 2, wherein said ferroelectric phase has a structure corresponding to one of tetragonal, orthorhombic, and rhombohedral crystal systems, or a mixture of structures corresponding to two or all of the tetragonal, orthorhombic, and rhombohedral crystal systems.

27. A piezoelectric device according to claim 3, wherein said ferroelectric phase has a structure corresponding to one of tetragonal, orthorhombic, and rhombohedral crystal systems, or a mixture of structures corresponding to two or all of the tetragonal, orthorhombic, and rhombohedral crystal systems.

28. A piezoelectric device according to claim 1, wherein said ferroelectric phase has a perovskite structure.

29. A piezoelectric device according to claim 2, wherein said ferroelectric phase has a perovskite structure.

30. A piezoelectric device according to claim 3, wherein said ferroelectric phase has a perovskite structure.

31. A piezoelectric device according to claim 28, wherein said piezoelectric film contains as a main component a perovskite oxide which is expressed by a compositional formula $ABO_3$, or a mixture of perovskite oxides each of which is expressed by a compositional formula $ABO_3$, A represents one or more A-site elements which are one or more of Pb, Ba, La, Sr, Bi, Li, Na, Ca, Cd, Mg, and K, B represents one or more B-site elements which are one or more of Ti, Zr, V, Nb, Ta, Cr, Mo, W, Mn, Sc, Co, Cu, In, Sn, Ga, Zn, Cd, Fe, Ni, and the lanthanide elements, O represents oxygen, and the ratio of each of the total molar amount of atoms of the one or more A-site elements and the total molar amount of atoms of the one or more B-site elements to the molar amount of oxygen atoms in each perovskite oxide may deviate from 1:3 within a range in which a perovskite structure can be formed.

32. A piezoelectric device according to claim 29, wherein said piezoelectric film contains as a main component a perovskite oxide which is expressed by a compositional formula $ABO_3$, or a mixture of perovskite oxides each of which is expressed by a compositional formula $ABO_3$, A represents one or more A-site elements which are one or more of Pb, Ba, La, Sr, Bi, Li, Na, Ca, Cd, Mg, and K, B represents one or more B-site elements which are one or more of Ti, Zr, V, Nb, Ta, Cr, Mo, W, Mn, Sc, Co, Cu, In, Sn, Ga, Zn, Cd, Fe, Ni, and the lanthanide elements, O represents oxygen, and the ratio of each of the total molar amount of atoms of the one or more A-site elements and the total molar amount of atoms of the one or more B-site elements to the molar amount of oxygen atoms in each perovskite oxide may deviate from 1:3 within a range in which a perovskite structure can be formed.

33. A piezoelectric device according to claim 30, wherein said piezoelectric film contains as a main component a perovskite oxide which is expressed by a compositional formula $ABO_3$, or a mixture of perovskite oxides each of which is expressed by a compositional formula $ABO_3$, A represents one or more A-site elements which are one or more of Pb, Ba, La, Sr, Bi, Li, Na, Ca, Cd, Mg, and K, B represents one or more B-site elements which are one or more of Ti, Zr, V, Nb, Ta, Cr, Mo, W, Mn, Sc, Co, Cu, In, Sn, Ga, Zn, Cd, Fe, Ni, and the lanthanide elements, O represents oxygen, and the ratio of each of the total molar amount of atoms of the one or more A-site elements and the total molar amount of atoms of the one or more B-site elements to the molar amount of oxygen atoms in each perovskite oxide may deviate from 1:3 within a range in which a perovskite structure can be formed.

34. A liquid discharge device comprising:
said piezoelectric device according to claim 1; and
a discharge member including,
  a liquid-reserve chamber which reserves liquid, and
  a liquid-discharge outlet through which said liquid is discharged from the liquid-reserve chamber.

35. A liquid discharge device comprising:
said piezoelectric device according to claim 2; and
a discharge member including,
  a liquid-reserve chamber which reserves liquid, and
  a liquid-discharge outlet through which said liquid is discharged from the liquid-reserve chamber.

36. A liquid discharge device comprising:
said piezoelectric device according to claim 3; and
a discharge member including,
  a liquid-reserve chamber which reserves liquid, and
  a liquid-discharge outlet through which said liquid is discharged from the liquid-reserve chamber.

* * * * *